United States Patent
Park et al.

(10) Patent No.: US 9,231,629 B2
(45) Date of Patent: Jan. 5, 2016

(54) ULTRA LOW POWER SUPER-REGENERATIVE RECEIVER AND METHOD THEREOF

(71) Applicant: Samsung Electronics Co., Ltd., Suwon-si (KR)

(72) Inventors: Chang Soon Park, Chungju-si (KR); Young Jun Hong, Seoul (KR); Joon Seong Kang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/729,190

(22) Filed: Dec. 28, 2012

(65) Prior Publication Data

US 2013/0170588 A1 Jul. 4, 2013

(30) Foreign Application Priority Data

Jan. 4, 2012 (KR) .................. 10-2012-0001027

(51) Int. Cl.
| | |
|---|---|
| *H04L 27/06* | (2006.01) |
| *H04B 1/06* | (2006.01) |
| *H03D 11/00* | (2006.01) |
| *H04B 1/24* | (2006.01) |

(52) U.S. Cl.
CPC .................. *H04B 1/06* (2013.01); *H03D 11/00* (2013.01); *H04B 1/24* (2013.01)

(58) Field of Classification Search
CPC .............. H04B 1/00; H04B 3/00; H04B 7/00; H04B 14/00; H04B 17/00; H04B 2001/00; H04B 2201/00; H04J 13/00; H04J 2013/00; H03K 7/00; H03K 9/00; H03L 7/00; H04L 1/00; H04L 5/00; H04L 7/00; H04L 25/00; H04L 27/00; H04L 2001/00; H04L 2007/00; H04L 2025/00; H04L 2027/00; H03M 5/00
See application file for complete search history.

(56) References Cited

U.S. PATENT DOCUMENTS

| | | | |
|---|---|---|---|
| 7,565,129 B2 | 7/2009 | Kim et al. | |
| 2002/0168957 A1* | 11/2002 | Mapes | ........................ 455/336 |
| 2010/0046354 A1* | 2/2010 | Miyamoto et al. | ......... 369/275.4 |
| 2010/0109783 A1 | 5/2010 | Bohorquez | |

FOREIGN PATENT DOCUMENTS

KR 10-2010-0040918 A 4/2010

OTHER PUBLICATIONS

Yoshimura et al.; A 622 Mb/s Bit/Frame Synchronizer for High Speed Backplane Data Communication; IEEE Journal of Solid State Cirucits; Jul. 1996; pp. 1063-1066.*

* cited by examiner

*Primary Examiner* — Adolf Dsouza
(74) *Attorney, Agent, or Firm* — NSIP Law

(57) ABSTRACT

An ultra low power super-regenerative receiver is provided. The ultra low power super-regenerative receiver includes a bit synchronizer configured to use a value sampled from a signal output from a super-regenerative oscillator to estimate a pulse-level position having a maximum amplitude value in a single period of a received symbol, a frame synchronizer configured to combine a plurality of pulse-level positions determined based on the estimated pulse-level position, and detect a predetermined bit sequence using the plurality of pulse-level positions combined, the frame synchronizer being configured to perform frame synchronization, and a data detector configured to detect data using the plurality of pulse-level positions determined after the frame synchronization is completed.

21 Claims, 22 Drawing Sheets

ULTRA LOW POWER SUPER-REGENERATIVE RECEIVER AND METHOD THEREOF

CROSS-REFERENCE TO RELATED APPLICATION(S)

This application claims the benefit under 35 U.S.C. §119(a) of Korean Patent Application No. 10-2012-0001027, filed on Jan. 4, 2012, in the Korean Intellectual Property Office, the entire disclosure of which is incorporated herein by reference for all purposes.

BACKGROUND

1. Field

The following description relates to an ultra low power super-regenerative receiver and method thereof.

2. Description of Related Art

With a rapid development and commercialization of wireless networking technology, a sensor network has been extending rapidly. Standardization of technology has been actively conducted based on IEEE. Examples of technologies that have been standardized include Bluetooth, IEEE 802.15.4, ZigBee, and the like.

A wireless sensor network may be used in various environments such as home security, medical fields, mobile health care, monitoring of a chemical and biological abnormality, diagnosis of a mechanical abnormality and malfunction, monitoring of an environment, sensing of information associated with a disaster, intelligent distribution management, real time security, remote monitoring, and the like.

The size of a sensor, in various wireless sensor networks and local area networks, may be relatively small. In order to operate a large number of sensors over a relatively long time period, the sensors need to require low power and have a low complexity.

For example, a wireless body area network (WBAN) in which sensors are installed in a human body, may need to meet rigorous standards of low power and low complexity in order to perform wireless communication with a neighboring mobile device and with another sensor in the human body.

To meet rigorous standards of low power and low complexity, an ultra-low power radio frequency (RF) structure may be used instead of a relatively high powered RF structure. However, the usage of an ultra-low power analog circuit may entail overall performance degradation in a system.

Accordingly, continued research on a technology to improve system performance while a sensor using the ultra-low power analog circuit is installed in a wireless sensor network or a local area network may be desired.

SUMMARY

According to a general aspect, an ultra low power super-regenerative receiver is provided. The ultra low power super-regenerative receiver includes a bit synchronizer configured to use a value sampled from a signal output from a super-regenerative oscillator to estimate a pulse-level position having a large amplitude value in a single period of a received symbol, a frame synchronizer configured to combine a plurality of pulse-level positions determined based on the estimated pulse-level position, and detect a predetermined bit sequence using the plurality of pulse-level positions combined, the frame synchronizer being configured to perform frame synchronization, and a data detector configured to detect data using the plurality of pulse-level positions determined after the frame synchronization is completed.

The bit synchronizer may estimate a pulse-level position and a code-level position having a maximum correlation value in the single period of the received symbol.

The frame synchronizer may include a combined object determining unit configured to determine a plurality of pulse-level positions to be combined based on the estimated pulse-level position, a first combiner configured to combine the determined plurality of pulse-level positions in the same bit period, and a signal power estimator configured to estimate a signal power of a signal generated by a combination of the determined plurality of pulse-level positions.

The combined object determining unit may determine pulse-level positions in which a number of pulse-level positions located on a left side of the estimated pulse-level position corresponds to a number of pulse-level positions located on a right side of the estimated pulse-level position, in the single period of the received symbol.

The combined object determining unit may calculate correlation values of pulse-level positions adjacent to the estimated pulse-level position in the single period of the received symbol, and determine the plurality of pulse-level positions in an order of sizes of the correlation values.

The combined object determining unit may calculate correlation values of pulse-level positions adjacent to the estimated pulse-level position in the single period of the received symbol, and determine pulse-level positions having correlation values exceeding a predetermined threshold to be the plurality of pulse-level positions to be combined.

The frame synchronizer may further include an update unit configured to update a sample time index of a sampled value based on an index of the estimated pulse-level position, an index of the estimated code-level position, and the plurality of pulse-level positions determined, a first selector configured to select the plurality of pulse-level positions determined by the combined object determining unit based on the updated sample time index, a second combiner configured to combine the plurality of pulse-level positions selected, and a bit sequence detector configured to detect the predetermined bit sequence based on a signal generated through a combination of the plurality of pulse-level positions by the second combiner and the signal power estimated by the signal power estimator.

The data detector may include a second selector configured to select the plurality of pulse-level positions determined by the combined object determining unit, based on the updated sample time index, after the predetermined bit sequence is detected, a third combiner configured to combine the plurality of pulse-level positions selected by the second selector, and a demodulator configured to demodulate data based on a signal generated through combination of the plurality of pulse-level positions by the third combiner and the signal power estimated by the signal power estimator.

The frame synchronizer may include a combined object determining unit configured to determine a plurality of pulse-level positions to be combined based on the estimated pulse-level position, and a signal power estimator configured to estimate a signal power of each of the plurality of pulse-level positions determined.

The frame synchronizer may further include an update unit configured to update a sample time index of a sampled value based on an index of the estimated pulse-level position, an index of the estimated code-level position, and the plurality of pulse-level positions determined, a first selector configured to select the plurality of pulse-level positions determined by the combined object determining unit based on the updated sample time index, a first combiner configured to linearly combine or nonlinearly combine the plurality of selected pulse-level positions, and a bit sequence detector configured to detect the predetermined bit sequence based on a signal generated through combination of the plurality of pulse-level positions by the first combiner and the signal power estimated by the signal power estimator.

The data detector may include a second selector configured to select the plurality of pulse-level positions determined by the combined object determining unit, based on the updated sample time index, after the predetermined bit sequence is detected, a second combiner configured to combine the plurality of pulse-level positions selected by the second selector in a combining scheme used by the first combiner, and a demodulator configured to demodulate data based on a signal generated through a combination of the plurality of pulse-level positions by the second combiner and the signal power estimated by the signal power estimator.

The large amplitude value may be a maximum amplitude value.

The pulse-level positions may be different from each other.

The frame synchronizer may determine the plurality of pulse-level positions before the pulse-level positions are combined.

According to another aspect, an ultra low power super-regenerative receiver is provided. The ultra low power super-regenerative receiver includes a bit synchronizer configured to estimate a pulse-level position and a code-level position having a large correlation value using a plurality of samples included in a predetermined sliding window in a single period of a received symbol among samples taken in a signal output from a super-regenerative oscillator, a frame synchronizer configured to combine a plurality of pulse-level positions determined based on the estimated pulse-level position, and detect a predetermined bit sequence using the combined plurality of pulse-level positions, the frame synchronizer being configured to perform frame synchronization, and a data detector configured to detect data using the plurality of estimated pulse-level positions, after the frame synchronization is completed.

The bit synchronizer may include a first combiner configured to combine the plurality of samples included in the predetermined sliding window among the samples to generate a plurality of combination pulse-level positions, a calculator configured to calculate correlation values between the plurality of combination pulse-level positions and an original code sequence, and calculate correlation values between the plurality of combination pulse-level positions and a circularly shifted code sequence, and an estimator configured to estimate the code-level position and a combination pulse-level position having a maximum correlation value as a result of calculation.

The frame synchronizer may include a signal power estimator configured to estimate a signal power of the estimated combination pulse-level position, an update unit configured to update a sample time index of sampled values based on an index of the estimated combination pulse-level position, and an index of the estimated code-level position, a first selector configured to select a plurality of pulse-level positions corresponding to the estimated combination pulse-level position based on the updated sample time index, a second combiner configured to combine the selected plurality of pulse-level positions, and a bit sequence detector configured to detect the predetermined bit sequence based on a signal generated through combination of the plurality of pulse-level positions by the second combiner and the signal power estimated by the signal power estimator.

The data detector may include a second selector configured to select a plurality of pulse-level positions corresponding to the estimated combination pulse-level position, based on the updated sample time index, after the predetermined bit sequence is detected, a third combiner configured to combine the plurality of selected pulse-level positions, and a demodulator configured to demodulate data based on a signal generated through combination of the plurality of pulse-level positions by the third combiner and the signal power estimated by the signal power estimator.

The frame synchronizer may include a signal power estimator configured to estimate a signal power of each of pulse-level positions included in the estimated combination pulse-level position, an update unit configured to update a sample time index of sampled values based on an index of the estimated combination pulse-level position, and an index of the estimated code-level position, a first selector configured to select a plurality of pulse-level positions corresponding to the estimated combination pulse-level position based on the updated sample time index, a second combiner configured to linearly combine or nonlinearly combine the plurality of pulse-level positions selected, and a bit sequence detector configured to detect the predetermined bit sequence based on a signal generated through combination of the plurality of pulse-level positions by the second combiner and the signal power estimated by the signal power estimator.

The data detector may include a second selector configured to select a plurality of pulse-level positions corresponding to the estimated combination pulse-level position, based on the updated sample time index, after the predetermined bit sequence is detected, a third combiner configured to combine the plurality of pulse-level positions selected by the second selector in a combining scheme used by the second combiner, and a demodulator configured to demodulate data based on a signal generated through combination of the plurality of pulse-level positions by the third combiner and the signal power estimated by the signal power estimator.

According to another aspect, an ultra low power super-regenerative receiving method is provided. The ultra low power super-regenerative receiving method includes estimating, using a value sampled from a signal output from a super-regenerative oscillator, a pulse-level position having a maximum amplitude value in a single period of a received symbol, combining a plurality of pulse-level positions determined based on the estimated pulse-level position, performing frame synchronization by detecting a predetermined bit sequence using the plurality of pulse-level positions combined, and detecting data using the plurality of pulse-level positions determined after the frame synchronization is completed.

The combining may include determining a plurality of pulse-level positions to be combined based on the estimated pulse-level position, and combining the determined plurality of pulse-level positions in the same bit period.

The large correlation value may be a maximum correlation value.

According to another aspect, an ultra low power super-regenerative receiving method is provided. The ultra low power super-regenerative receiving method includes estimating a pulse-level position and a code-level position having a maximum correlation value using a plurality of samples included in a predetermined sliding window in a single period of a received symbol among samples taken in a signal output from a super-regenerative oscillator, combining a plurality of pulse-level positions determined based on the estimated pulse-level position, performing frame synchronization by detecting a predetermined bit sequence using the combined plurality of pulse-level positions, and detecting data using the plurality of pulse-level positions estimated, after the frame synchronization is completed.

The estimating may include combining the plurality of samples included in the predetermined sliding window among the samples to generate a plurality of combination pulse-level positions, calculating correlation values between the plurality of combination pulse-level positions and an original code sequence, and calculating correlation values between the plurality of combination pulse-level positions and a circularly shifted code sequence, and estimating the code-level position and a combination pulse-level position having a maximum correlation value as a result of calculation.

Other features and aspects may be apparent from the following detailed description, the drawings, and the claims.

Figure 1:
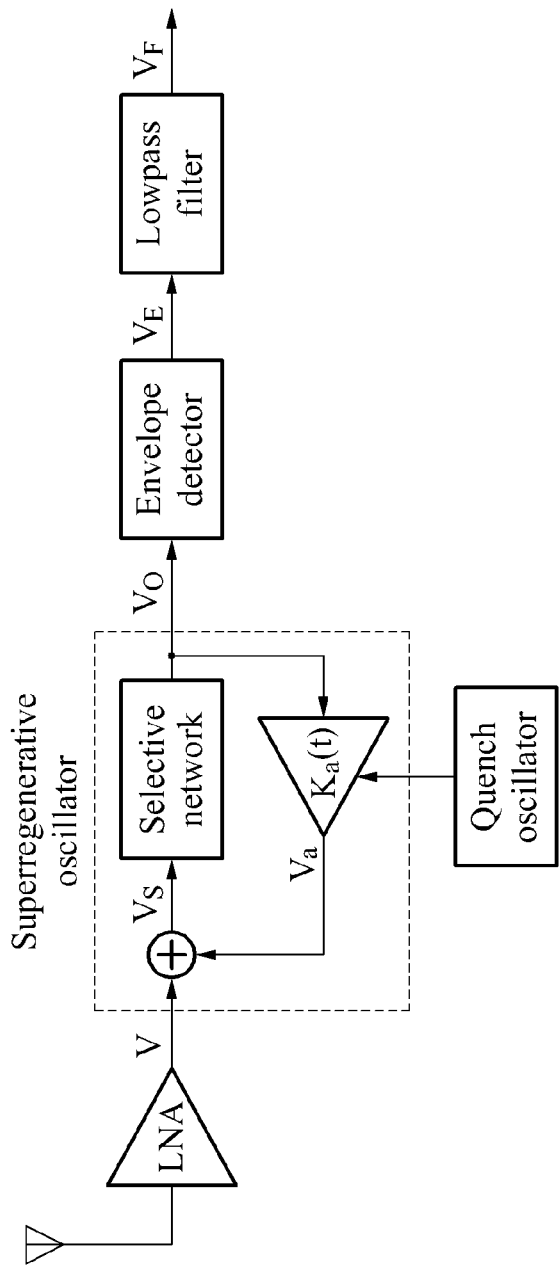
FIG. 1 is a block diagram illustrating a general super-regenerative receiver.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Various sensor devices installed in a wireless sensor network or a local area network may be designed to be relatively small, and the various sensor devices may operate using low power and low complexity.

A conventional receiver in a super heterodyne radio frequency (RF) structure may enhance sensitivity, and the like using an intermediate frequency band instead of directly transforming a received signal from a high-frequency band to a baseband. Using the intermediate frequency band may bring about an increase in complexity, cost, power consumption, and the like.

In particular, a modem technology in the super heterodyne RF structure may use relatively high power in an RF portion in comparison to power used in a digital baseband portion. For example, in a modem chip for a low power wireless personal area network (WPAN), consumption power in a digital signal processing portion may correspond to 0.5 milliwatts (mW) in both a transmission mode and reception mode. On the other hand, power consumption in an analog signal processing portion may correspond to 21 mW in a reception mode and 30 mW in a transmission mode.

Thus, research is being actively conducted into reducing power of an overall communication modem using various low power RF structures. In particular, a receiver structure using a super-regenerative receiver may relate to a structure that amplifies an output signal using a positive feedback structure to detect a signal, and the receiver structure may relate to a relatively simple RF structure using a relatively small number of active elements. Thus, the super-regenerative receiver may relate to an ultra low power receiver.

By having a short distance transmission and reception system use a low power and low complexity RF structure, the system may significantly reduce power consumption. As another aspect, performance of an overall system may deteriorate due to performance degradation in an analog signal processing portion.

The super-regenerative receiver may involve significant performance degradation due to a low selectively characteristic of a frequency response.

FIG. 1 illustrates an example of a general super-regenerative receiver.

Referring to FIG. 1, an RF signal passing through a low noise amplifier (LNA) may be input to a super-regenerative oscillator (SRO). The SRO having a positive feedback loop having a gain of $K_a(t)$ may amplify the RF signal. As another aspect, continuous amplification may cause an oscillation and thus, the oscillation may be required to be terminated. A quench oscillator may control a periodic generation and extinction of the oscillation. A series of graphs of FIG. 2 may illustrate the RF signal input to the SRO, an output signal output from the SRO, and a damping function of a closed-loop system through the positive feedback loop.

An envelope detector may detect an envelope from an output signal of the SRO. A low-pass filter may filter a predetermined area in the detected envelope. Bit synchronization, frame synchronization, and data detection may be performed on a filtered signal.

Figure 2:
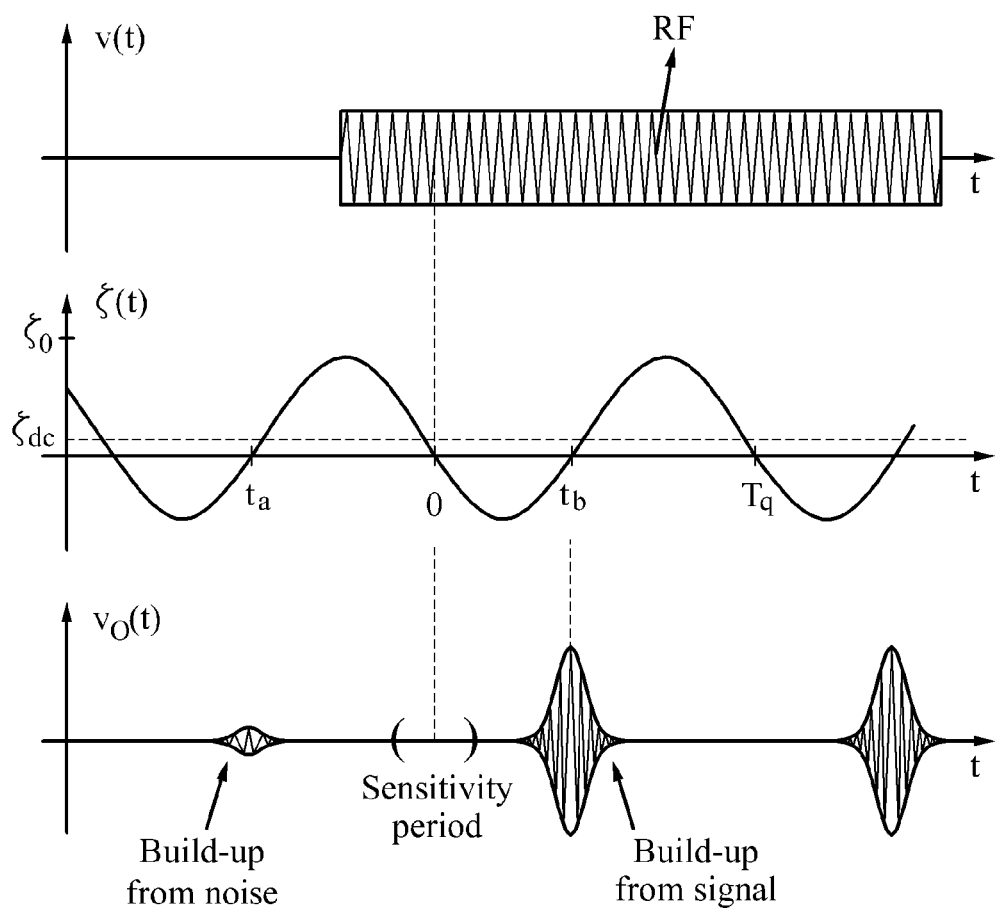
FIG. 2 is a series of graphs illustrating an input signal, a damping function, and an output signal of a super-regenerative oscillator.

FIG. 2 illustrates an example of an input signal, a damping function, and an output signal of an SRO.

Referring to FIG. 2, in response to an RF signal v(t) being input to an SRO, an SRO output $v_o(t)$ is generated in a series of RF pulses in which a periodic generation and extinction is repeated for each quench period $T_q$.

In this example, $\zeta(t)$ may correspond to a damping function of a closed-loop system, and $\zeta(t)$ may vary depending on a signal of a quench oscillator. In response to a value of $\zeta(t)$ changing from a positive number to a negative number, an SRO output signal may begin oscillating, and an unstable period may begin in which an amplitude value may gradually increase. The unstable period may continue until the value of $\zeta(t)$ reverts to a positive number from a negative number. In response to the amplitude value reaching a maximum value, a stable period may begin in which the amplitude value starts to decrease.

An RF pulse generated in an SRO output during a single quench period may occur in a subsequent quench period, and the RF pulse generated in the SRO output may overlap with an RF pulse initially generated in the subsequent quench period. The overlapping may thereby cause intersymbol interference (ISI). A phenomenon when the ISI occurs may be referred to as a hangover phenomenon. In this case, $\zeta(t)$ may have a $\zeta_{dc}$ value corresponding to a direct current (DC) component value to remove the hangover phenomenon.

An amplitude value of the SRO output $v_o(t)$ may correspond to an amplitude value of the RF signal v(t). For example, as an amplitude value of the SRO output $v_o(t)$ increases an amplitude value of the RF signal v(t) may increase.

A regenerative gain may corresponds to a main factor for determining a magnitude of the amplitude value of the SRO output $v_o(t)$. An integration of a sensitivity curve and a normalized envelope of the RF signal v(t) input to the SRO may determine the regenerative gain.

In response to the RF signal v(t) of the SRO being v(t)=V$p_c$(t)cos($\omega_0$t+$\phi$), the SRO output $v_o(t)$ may be calculated as follows.

$v_o(t) = VK_0 K_s K_r p(t)\cos(\omega_0 t + \phi)$ $K_r = \zeta_0 \omega_0 \int_{t_a}^{t_b} p_c(\tau) s(\tau) d\tau$ $s(t) = \exp(\omega_0 \int_0^t \zeta(\lambda) d\lambda)$ $p(t) = \exp(-\omega_0 \int_{t_b}^t \zeta(\lambda) d\lambda)$ In this example, $p_c(t)$ may relate to a pulse envelope in which a maximum is normalized to "1." $K_r$ may relate to a regenerative gain, s(t) may relate to a sensitivity curve, and p(t) may relate to a normalized envelope of an SRO output.

Integration of s(t) and $p_c(t)$ in addition to a value V corresponding to a peak amplitude of the RF signal v(t) may determine an amplitude of the SRO output $v_o(t)$.

A peak amplitude of the SRO output $v_o(t)$ may not rely on the peak amplitude of the RF signal v(t). The peak amplitude of the SRO output $v_o(t)$ may be determined based on s(t) and $p_c(t)$ overlapping one another to capture input energy.

Figure 3:
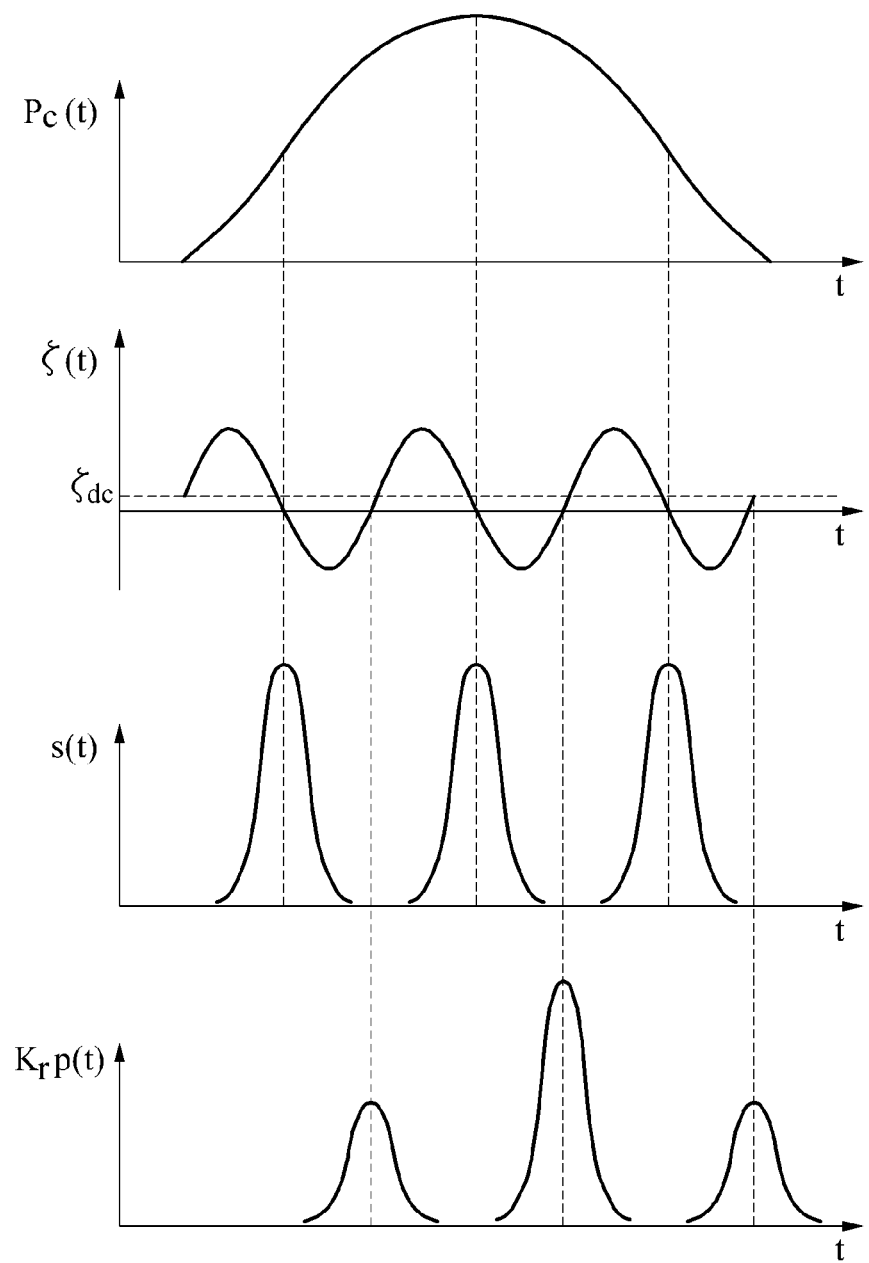
FIG. 3 is a series of graphs illustrating a normalized envelope of an input signal, a damping function, a sensitivity curve, and a product of a regenerative gain and a normalized envelope of an output signal of a super-regenerative oscillator (SRO).

As another example, examples of signal forms $p_c(t)$, s(t), and $K_r p(t)$ according to $\zeta(t)$ are illustrated in FIG. 3.

FIG. 3 illustrates examples of a normalized envelope of an input signal, a damping function, a sensitivity curve, and a product of a regenerative gain and a normalized envelope of an output signal of an SRO.

Referring to FIG. 3, s(t) exponentially increases and then exponentially decreases based on a turning point in time that corresponds to a value of $\zeta(t)$ where $\zeta(t)$ changes from a positive number to a negative number.

$K_r p(t)$ exponentially increases and then exponentially decreases based on a turning point in time that corresponds to a value of $\zeta(t)$ where $\zeta(t)$ changes from a negative number to a positive number. In response to s(t) seldom overlapping with $K_r p(t)$ in FIG. 3, integration of s(t) and $K_r p(t)$ may correspond to a substantially zero value, and an amplitude value of an SRO output envelope may correspond to a substantially zero value.

s(t) may capture energy of an SRO input envelope, and reflect the corresponding amplitude on a peak amplitude of an SRO output. The SRO output envelope may at some time appear delayed from a position of s(t) on a time axis.

As illustrated in FIG. 3, a receiver having an ultra-low power super-regenerative RF structure applied, may have difficulty in obtaining an accurate shape for a transmitted signal in a baseband. Difficulty in obtaining the accurate shape for the transmitted signal in the baseband may be different from a characteristic in a conventional high power and high quality super-heterodyne RF receiver.

An SRO output may not be related to a signal output through a frequency conversion to restore a signal in a baseband of an RF input signal.

Since the SRO output may correspond to a newly generated signal in a different shape oscillated in response to an RF input signal at a predetermined frequency in a positive feedback, the SRO output may have a shape independent of an envelope of a transmitted signal.

The corresponding result may constrain an application of a receiving algorithm, in general, used for a conventional RF receiver. Thus, a conventional receiving algorithm may be changed and applied.

s(t) may have a shape that is concentrated at a zero-crossing point of $\zeta(t)$ due to a characteristic of exponentially changing over time. In this example, the zero-crossing point refers to a point where $\zeta(t)$ changes from a positive number to a negative number.

s(t) may have a relatively narrow shape on the time axis in comparison to an envelope of the RF input signal. The relatively narrow shape of s(t) may degrade a selectivity characteristic of a super-regenerative receiver. Thus, the relatively narrow shape of s(t) may decrease a signal-to-noise ratio (SNR) value.

According to Fourier transform theory and regarding a transformation from a time domain to a frequency domain, a wide signal on a time axis may have a narrow characteristic on the frequency domain, and a narrow signal on a time axis may have a wide characteristic on the frequency domain.

Thus, receiving s(t), of a narrow characteristic, an RF input signal wide in the time domain in an SRO may correspond to receiving, as a wide frequency bandwidth of the SRO, a narrow frequency bandwidth of the RF input signal in response to being viewed from the frequency domain.

Receiving a signal in a relatively wide frequency domain in response to being compared to the RF input signal may entail receiving a power of an additive white Gaussian noise (AWGN) greater than a power of the RF input signal, which may lead to deterioration of the SNR value.

Figure 4:
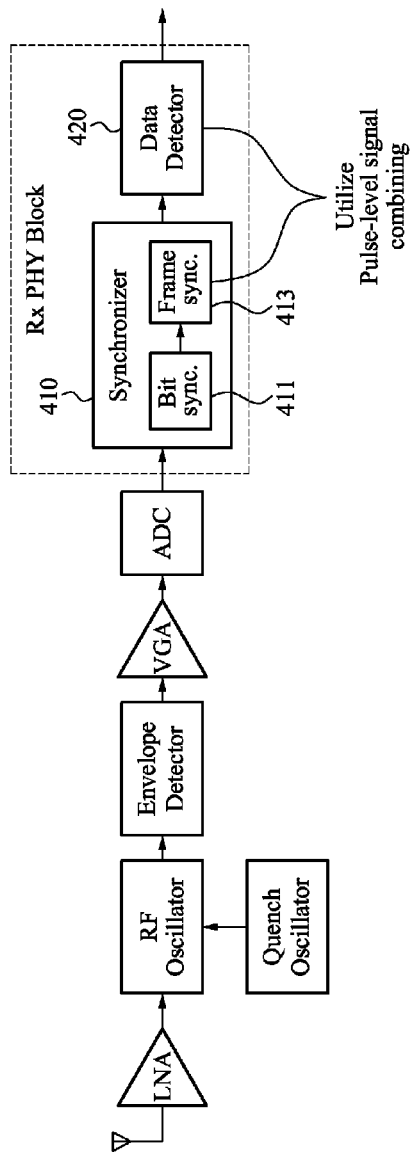
FIG. 4 is a block diagram illustrating an example of an ultra low power super-regenerative receiver.

FIG. 4 illustrates an example of an ultra low power super-regenerative receiver.

Referring to FIG. 4, an RF signal passing through an LNA may be input to an SRO. The SRO may use a positive feedback loop having a gain of $K_a(t)$ to amplify an RF signal at a predetermined frequency. A quench oscillator may control a periodic generation and extinction of the oscillation. An output signal of the SRO may pass through an envelope detector and a variable gain amplifier (VGA).

An analog-digital converter (ADC) may sample ADC sample values for peak values of an envelope. The ADC sample values may be used for a synchronization process in a synchronizer 410.

A synchronization signal process may be divided into bit synchronization that performs synchronization on a time axis. The synchronization may be performed in a bit unit and frame synchronization that performs synchronization in a bit sequence unit. A bit sequence may indicate a start of a frame.

A frame synchronizer 413 may use synchronization information to demodulate a plurality of bits, in a bit unit, acquired from a bit synchronizer 411, and thereby the frame synchronizer 413 may detect a bit sequence.

The bit synchronizer 411 may search for a greatest ADC sample value in a single period of a received symbol to estimate an optimal position on a time axis.

In response to a direct sequence spread spectrum (DSSS) scheme modulating a transmitted symbol, a period of the received symbol may correspond to a period of a single chip symbol, and multiplying a spreading factor by a period of the single chip symbol may obtain a value corresponding to a period of a single bit.

In this example, in response to the spreading factor being greater than or equal to 2, an estimating operation of an optimal code-level position in a single bit period as well as an estimating operation of a pulse-level position in a period of a single received symbol may be performed for bit synchronization.

The bit synchronizer 411 may calculate correlation values between circularly shifted code sequences available for pulse-level positions to acquire a large correlation value, and estimate a pulse-level position and a code-level position having the large correlation value. The pulse-level positions may be different from each other. The large correlation value may be a maximum correlation value.

The frame synchronizer 413 and a data detector 420 may use a pulse-level signal combining scheme. The pulse-level signal combining scheme may refer to determining a plurality of pulse-level positions based on a pulse-level position estimated in the bit synchronizer 411, and combining the plurality of determined pulse-level positions. The ultra low power super-regenerative receiver may combine the plurality of pulse-level positions to perform frame synchronization and data detection. Thus, the receiver may increase an SNR of a received signal.

Figure 5:
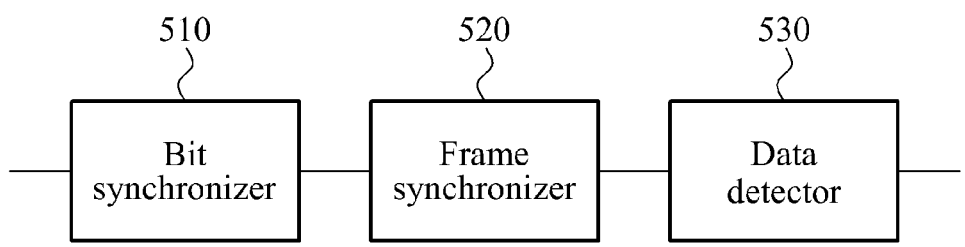
FIG. 5 is a block diagram illustrating an example of a synchronizer 410 and a data detector 420 of FIG. 4.

FIG. 5 illustrates an example of the synchronizer 410 and the data detector 420 of FIG. 4. The synchronizer 410 includes the bit synchronizer 411 and the frame synchronizer 413. Referring to FIG. 5, the bit synchronizer 411 corresponds to a bit synchronizer 510, the frame synchronizer 413 corresponds to a frame synchronizer 520, and the data detector 420 corresponds to a data detector 530.

The bit synchronizer 510 may use a value sampled from a signal output from a super-regenerative oscillator to estimate a pulse-level position having a large amplitude value in a single period of a received symbol. In this instance, the sampled value may refer to an ADC sampled value. The bit synchronizer 510 may use the estimated pulse-level position to synchronize a bit of a transmitted symbol and a bit of a received symbol. The large amplitude value may be a maximum amplitude value.

The bit synchronizer 510 may estimate a pulse-level position and a code-level position having a maximum correlation value in a single period of a received symbol. A DSSS scheme may modulate the received symbol. In other words, a spreading factor may be greater than or equal to 2 in a single chip symbol period.

The frame synchronizer 520 may determine a plurality of pulse-level positions to be combined. The determination of the plurality of pulse-level positions may be based on the pulse-level position estimated by the bit synchronizer 510. The frame synchronizer 520 may combine the determined plurality of pulse-level positions.

The frame synchronizer 520 may detect a predetermined bit sequence using the combined plurality of pulse-level positions to perform frame synchronization. In this instance, the predetermined bit sequence may indicate a start of a frame.

The data detector 530 may detect data using the plurality of pulse-level positions. The frame synchronizer 520 may determine the plurality of pulse-level positions after the frame synchronization is completed. In response to the frame synchronization being completed, sample values that are taken in a subsequent received symbol may refer to data.

The data detector 530 may select and combine sample values that correspond to the plurality of determined pulse-level positions, among sample values, by the frame synchronizer 520, thereby detecting data.

Figure 6:
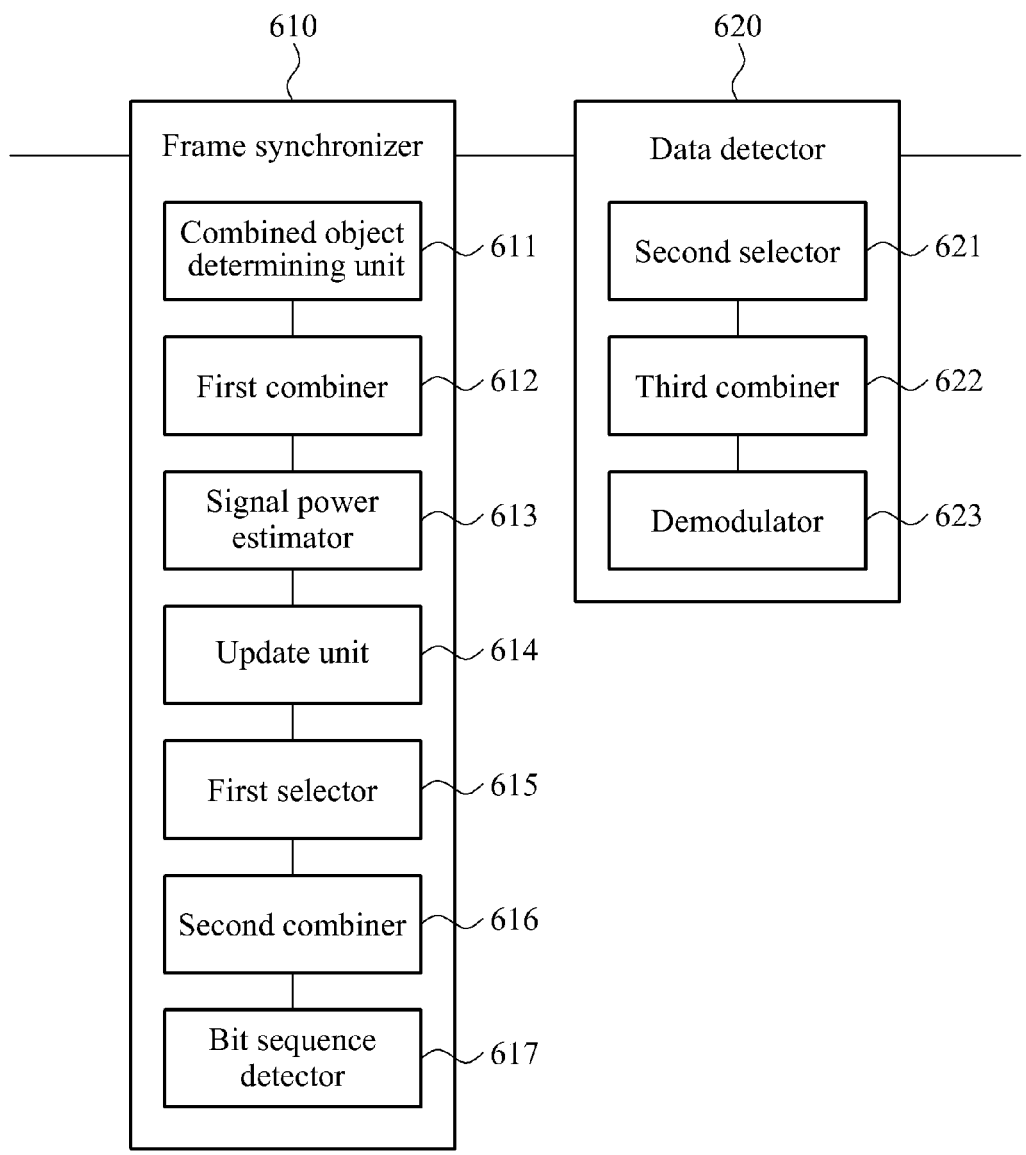
FIG. 6 is a block diagram illustrating an example of a frame synchronizer 520 and a data detector 530 of FIG. 5.

FIG. 6 illustrates an example of the frame synchronizer 520 and the data detector 530 of FIG. 5.

Referring to FIG. 6, the frame synchronizer 520 corresponds to a frame synchronizer 610, and the data detector 530 corresponds to a data detector 620.

The frame synchronizer 610 includes a combined object determining unit 611, a first combiner 612, a signal power estimator 613, an update unit 614, a first selector 615, a second combiner 616, and a bit sequence detector 617.

The combined object determining unit 611 may determine a plurality of pulse-level positions, corresponding to a combined object, and based on the estimated pulse-level position in a bit synchronization operation to be combined. The pulse-level positions may be different from each other.

The combined object determining unit 611 may determine pulse-level positions at which a number of pulse-level positions located on a left side of the estimated pulse-level position corresponds to a number of pulse-level positions located on a right side of the estimated pulse-level position, in the single period of the received symbol. In this example, the single period of the received symbol may refer to a period of a single chip symbol.

The combined object determining unit 611 may calculate correlation values of pulse-level positions adjacent to the pulse-level position estimated in the bit synchronization operation in the single period of the received symbol, and determine the plurality of pulse-level positions to be the combined object in an order of sizes of the correlation values.

The combined object determining unit 611 may calculate correlation values of pulse-level positions adjacent to the pulse-level position estimated in the bit synchronization operation in the single period of the received symbol, and determine pulse-level positions having correlation values exceeding a predetermined threshold to be the combined object. A pulse-level position having a significantly lower correlation value than a predefined value may be excluded from the combined object.

The first combiner 612 may combine the plurality of pulse-level positions determined by the combined object determining unit 611 in the same bit period. The same bit period may refer to a period indicating a single bit symbol. The first combiner 612 may combine the plurality of pulse-level positions for each chip unit. The first combiner 612 may apply the same weighting to each of the plurality of pulse-level positions to combine the plurality of pulse-level positions, in a scheme which may be defined as an equal gain combining scheme.

A combination of the first combiner 612 and the signal power estimator 613 may generate a signal power of a signal. The signal power of a signal may be estimated by the signal power estimator 613. The signal power estimator 613 may estimate a signal power of the plurality of pulse-level positions combined for each chip unit. In other words, as many signal powers as a number of spreading factors may be estimated in the same bit period. In this instance, a criterion for detection of a bit sequence and detection of data may subsequently be determined, may be based on the estimated signal powers.

The update unit 614 may update a sample time index of a sample taken in the bit synchronization operation based on an index of the pulse-level position, an index of the estimated code-level position, and the plurality of pulse-level positions. The index of the pulse-level position may be estimated in the bit synchronization operation. The combined object determining unit 611 may determine the plurality of pulse-level positions. The sample time index may refer to an index related to a time axis of sampled values. In this example, the sample time index may be updated to combine samples determined for the same bit period in a frame synchronization operation.

The first selector 615 may select the plurality of pulse-level positions based on the updated sample time index. The combined object determining unit 611 may determine the plurality of pulse-level positions. The first selector 615 may select the plurality of determined pulse-level positions for values of samples subsequent to those used in the bit synchronization operation.

The second combiner 616 may combine the plurality of selected pulse-level positions. The second combiner 616 may use the equal gain combining scheme to combine the plurality of pulse-level positions.

The bit sequence detector 617 may detect a predetermined bit sequence based on a signal. The second combiner 616 and the signal power estimated by the signal power estimator 613 may be combined to generate the signal. The signal power may be a criterion for determining whether a detected bit value corresponds to "0" or "1." The signal power estimator 613 may estimate the signal power.

For example, in response to the signal generated through a combination performed by the second combiner 616 having a value greater than the signal power estimated by the signal power estimator 613, the bit sequence detector 617 may determine that a value of "1" is received. In response to the signal having a value less than the signal power, the bit sequence detector 617 may determine that a value of "0" is received. In response to the bit sequence detector 617 detecting a predetermined bit sequence between a transmission end and a reception end, the bit sequence detector 617 may determine that a frame is synchronized.

The data detector 620 includes a second selector 621, a third combiner 622, and a demodulator 623.

The second selector 621 may select the plurality of pulse-level positions, based on the updated sample time index, after the bit sequence detector 617 detects the predetermined bit sequence. The combined object determining unit 611 may determine the plurality of pulse-level positions.

The second selector 621 may select samples matching the plurality of determined pulse-level positions among sampled values subsequent to those used in the frame synchronization operation.

The third combiner 622 may combine the plurality of pulse-level positions. The second selector 621 may select the plurality of pulse-level positions. In this example, the third combiner 622 may use the equal gain combining scheme to combine the plurality of pulse-level positions.

The demodulator 623 may demodulate data based on a signal. The signal may be generated through the combination and the signal power estimated by the signal power estimator 613. The third combiner 622 may perform the combination.

The demodulator 623 may determine a received symbol to be a value of "1" in response to the signal generated through the combination performed by the third combiner 622 exceeding the signal power estimated by the signal power estimator 613, and may otherwise determine the received symbol to be a value of "0".

Figure 7:
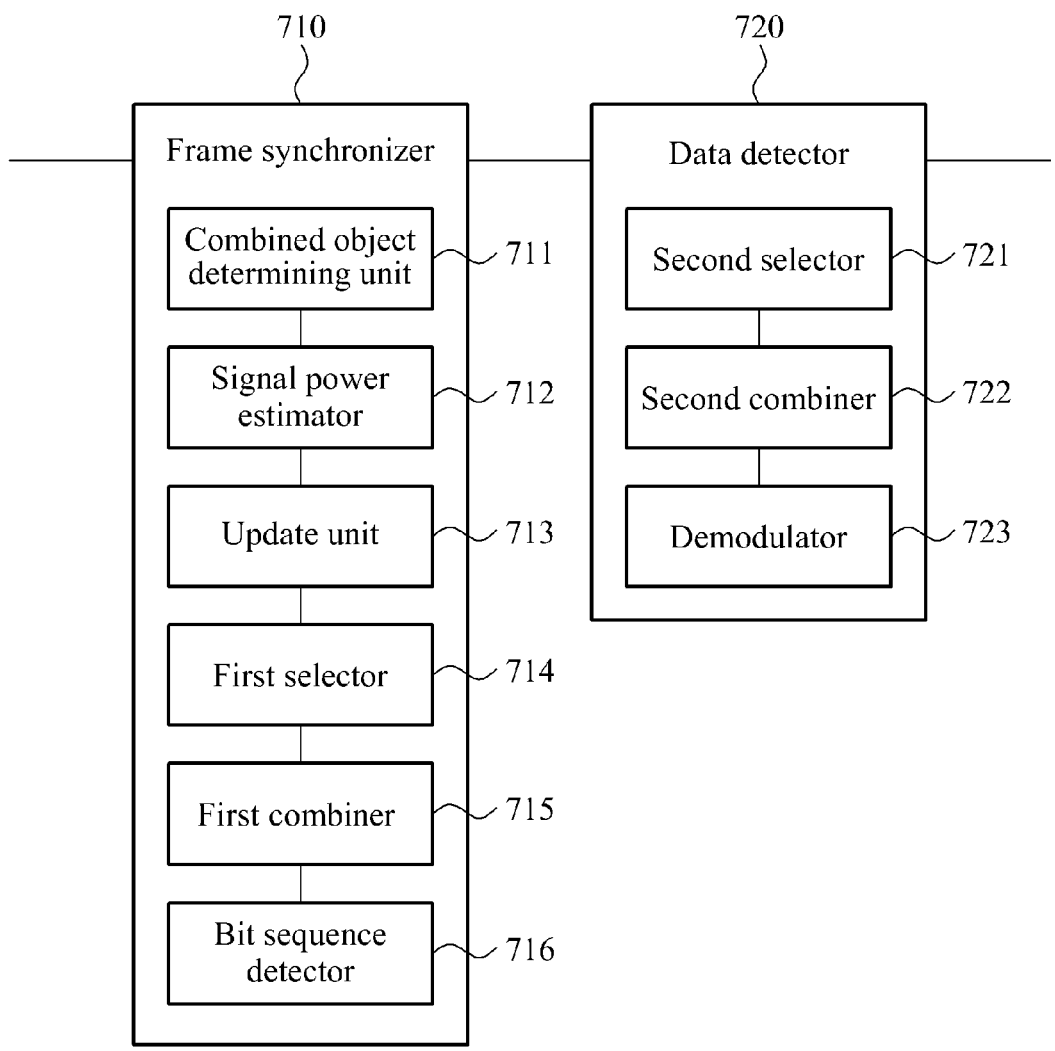
FIG. 7 is a block diagram illustrating an example of a frame synchronizer 520 and a data detector 530 of FIG. 5.

FIG. 7 illustrates an example of a frame synchronizer 520 and a data detector 530 of FIG. 5.

Referring to FIG. 7, the frame synchronizer 520 corresponds to a frame synchronizer 710, and the data detector 530 corresponds to a data detector 720.

The frame synchronizer 710 includes a combined object determining unit 711, a signal power estimator 712, an update unit 713, a first selector 714, a first combiner 715, and a bit sequence detector 716.

The combined object determining unit 711 may determine that a plurality of pulse-level positions is combined based on a pulse-level position. The pulse-level position may be estimated in a bit synchronization process.

The signal power estimator 712 may estimate a signal power of each of the plurality of determined pulse-level positions. The combined object determining unit 711 may determine the plurality of pulse-level positions.

The update unit 713 may update a sample time index of a value sampled in the bit synchronization process based on an index of the pulse-level position, an index of the estimated code-level position, and the plurality of pulse-level positions determined by the combined object determining unit 711. The pulse-level position may be estimated in the bit synchronization process.

The first selector 714 may select the plurality of determined pulse-level positions based on the updated sample time index. The first selector 714 may select the plurality of determined pulse-level positions for values of samples subsequent to those used in the bit synchronization operation. The combined object determining unit 711 may determine the pulse-level positions.

The first combiner 715 may linearly combine or nonlinearly combine the plurality of selected pulse-level positions. The first combiner 715 may determine that a linear combination or a nonlinear combination is to be performed based on a signal power of each of the selected plurality of pulse-level positions. The first combiner 715 may apply a weighting to each of the plurality of pulse-level positions, based on a signal power of each of the selected plurality of pulse-level positions. In this instance, each signal power may be estimated by the signal power estimator 712.

The bit sequence detector 716 may detect a predetermined bit sequence based on a signal generated through combination of the plurality of pulse-level positions and the estimated signal power. The first combiner 715 may combine the plurality of pulse-level positions. The signal power estimator 712 may estimate the signal power. The signal power estimated by the signal power estimator 712 may be a criterion for determining whether a detected bit value corresponds to a value of "0" or a value of "1." In response to the bit sequence detector 716 detecting a predetermined bit sequence between a transmission end and a reception end, the bit sequence detector 716 may determine that a frame is synchronized.

The data detector 720 includes a second selector 721, a second combiner 722, and a demodulator 723.

The combined object determining unit 711 may determine the plurality of pulse-level positions. The second selector 721 may select the plurality of determined pulse-level positions, based on the updated sample time index, after the predetermined bit sequence is detected by the bit sequence detector 716.

The second combiner 722 may combine the plurality of pulse-level positions selected by the second selector 721 in a combining scheme used by the first combiner 715. In response to the first combiner 715 using a linear combining scheme, the second combiner 722 may also use the linear combining scheme.

The demodulator 723 may demodulate data based on a signal generated through combination of the plurality of pulse-level positions by the second combiner 722 and the signal power. The signal power estimator 712 may estimate the signal power.

Figure 8:
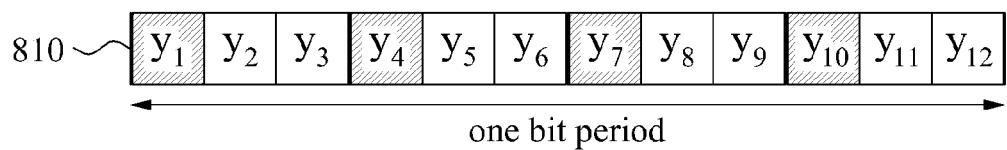
FIG. 8 is a diagram illustrating an example of determining a plurality of pulse-level positions in an ultra low power super-regenerative receiver.
Figure 8:
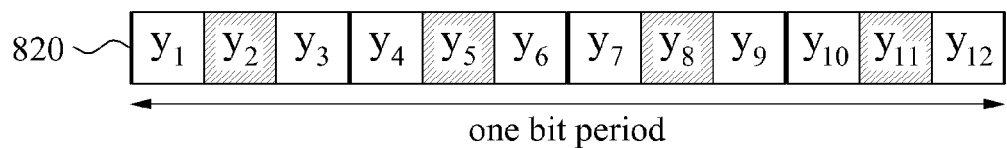
Figure 8:
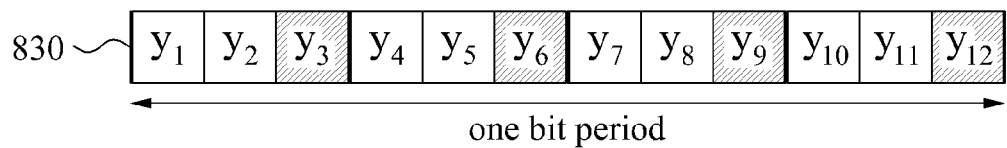

FIG. 8 illustrates an example of determining a plurality of pulse-level positions in an ultra low power super-regenerative receiver.

An ultra low power super-regenerative receiver may calculate a correlation value of a pulse-level position adjacent to a pulse-level position having a large correlation value to determine a pulse-level position corresponding to a combined object. The large correlation value may be a maximum correlation value.

In response to M ADC sample values being sampled for a single chip symbol, and a spreading factor corresponding to L of a DSSS scheme, ML ADC sample values may be obtained in a symbol period of a single bit.

For example, for M=3 and L=4, ADC samples of $y_1$, $y_2$, ..., $y_{12}$ may be obtained in chronological order during a symbol period of a single bit in a bit synchronization operation.

In this instance, in response to a code sequence at a transmission end corresponding to C=[$c_1$, $c_2$, $c_3$, $c_4$], three cases 810, 820, and 830 of [$y_1$, $y_4$, $y_7$, $y_{10}$]·[$c_4$, $c_1$, $c_2$, $c_3$]$^T$, [$y_2$, $y_5$, $y_8$, $y_{11}$]·[$c_4$, $c_1$, $c_2$, $c_3$]$^T$, and [$y_3$, $y_6$, $y_9$, $y_{12}$]·[$c_4$, $c_1$, $c_2$, $c_3$]$^T$ may have a large correlation value at a reception end. The large correlation value may be a maximum correlation value.

FIG. 8 illustrates the three cases 810, 820, and 830. In other words, the case 810 corresponds to [$y_1$, $y_4$, $y_7$, $y_{10}$]·[$c_4$, $c_1$, $c_2$, $c_3$]$^T$, the case 820 corresponds to [$y_2$, $y_5$, $y_8$, $y_{11}$]·[$c_4$, $c_1$, $c_2$, $c_3$]$^T$, and the case 830 corresponds to [$y_3$, $y_6$, $y_9$, $y_{12}$]·[$c_4$, $c_1$, $c_2$, $c_3$]$^T$. Here, [·]$^T$ may relate to a transpose of a vector.

ADC samples colored in grey indicate a case in which a large correlation value exists at first, second, and third pulse-level positions in response to the code sequence starting from a second chip symbol position, in other words, in response to a circularly shifted code sequence equaling [$c_4$, $c_1$, $c_2$, $c_3$].

In response to a correlation value to be calculated at a pulse-level position on a left of the pulse-level position having a large correlation value in the case 810, [$y_3$, $y_6$, $y_9$, $y_{12}$] may be selected as ADC sample values, and [$c_1$, $c_2$, $c_3$, $c_4$] may be selected as a circularly shifted code sequence, thereby calculating a correlation value [$y_3$, $y_6$, $y_9$, $y_{12}$]·[$c_1$, $c_2$, $c_3$, $c_4$]$^T$. The large correlation value may be a maximum correlation value.

A circularly shifted code sequence [$c_4$, $c_1$, $c_2$, $c_3$] may be multiplied by [$y_1$, $y_4$, $y_7$, $y_{10}$] corresponding to a case having a large correlation value while [$c_1$, $c_2$, $c_3$, $c_4$] corresponding to a code sequence circularly shifted in a left direction may be multiplied by [$y_3$, $y_6$, $y_9$, $y_{12}$] to obtain a correlation value. The large correlation value may be a maximum correlation value.

A pulse-level position and the pulse-level position having a large correlation value adjacent to one another may be included in the same chip symbol period to be combined. Thus, a code sequence may be circularly shifted in a left direction so that $y_3$ and $y_4$ may be included in the same chip symbol period. The large correlation value may be a maximum correlation value.

In response to a correlation value to be calculated at a pulse-level position on a left of the pulse-level position having a large correlation value in the case 820, [$y_1$, $y_4$, $y_7$, $y_{10}$] may be selected as ADC sample values, and [$c_4$, $c_1$, $c_2$, $c_3$] having a large correlation value may be selected as a circularly shifted code sequence. The large correlation value may be a maximum correlation value.

In response to a correlation value to be calculated at a pulse-level position on a right of the pulse-level position having a large correlation value in the case 830, [$y_1$, $y_4$, $y_7$, $y_{10}$] may be selected as ADC sample values, and [$c_3$, $c_4$, $c_1$, $c_2$] circularly shifted in a right direction from [$c_4$, $c_1$, $c_2$, $c_3$] having a large correlation value may be selected as a circularly shifted code sequence. The large correlation value may be a maximum correlation value.

Values calculated in a bit synchronization operation and stored in a memory may be used as correlation values to calculate a correlation value. The large correlation value may be a maximum correlation value.

A scheme of calculating a correlation value of a pulse-level position adjacent to the pulse-level position having a large correlation value may be generalized to be expressed as detailed in the following. The large correlation value may be a maximum correlation value.

A pulse-level position m* and a code-level position l* having a large correlation value estimated in the bit synchronization operation may be calculated by the following equation. The large correlation value may be a maximum correlation value.

$$(m^*, l^*) = \arg \max_{1 \leq m \leq M, 1 \leq l \leq L} Y(m) \cdot C(l)^T$$

Where Y(m)=[$y_m$, $y_{m+M}$, ..., $y_{m+(L-1)M}$] and C(1)=[$c_1$, $c_2$, $c_3$, ..., $c_L$], C(2)=[$c_L$, $c_1$, $c_2$, ..., $c_{L-1}$], C(3)=[$c_{L-1}$, $c_L$, $c_1$, ..., $c_{L-2}$], ..., C(L)=[$c_2$, $c_3$, $c_4$, ..., $c_L$, $c_1$]

In response to an index of a pulse-level position adjacent to the pulse-level position m* by i in a right direction being related to $\tilde{m}$=m*+i, and an index of a pulse-level position adjacent to the pulse-level position m* by i in a left direction being related to $\tilde{m}$=m*−i, a correlation value R($\tilde{m}$) for $\tilde{m}$ may be calculated using the following equation.

$$R(\tilde{m}) = \begin{cases} Y(f_M(\tilde{m})) \cdot C(f_L(l^*-1))^T, & \text{for } \tilde{m} < 1 \\ Y(\tilde{m}) \cdot C(l^*)^T, & \text{for } 1 \leq \tilde{m} \leq M \\ Y(f_M(\tilde{m})) \cdot C(f_L(l^*+1))^T, & \text{for } \tilde{m} > M \end{cases}$$

Where $f_X(x)$ is the modulo-X operator and $f_X(x) \in \{1, 2, ..., X\}$ (X: positive integer)

Since indices of pulse-level positions to be combined may be included in the same chip symbol period, m̂ may satisfy a requirement of |m̂−m*|<M. A difference between a maximum index and a minimum index may be less than M among indices of all selected pulse-level positions.

A correlation value may be repeatedly calculated in a plurality of bit symbol periods, and an average of a number of the corresponding bits may be used as the correlation value.

Figure 9:
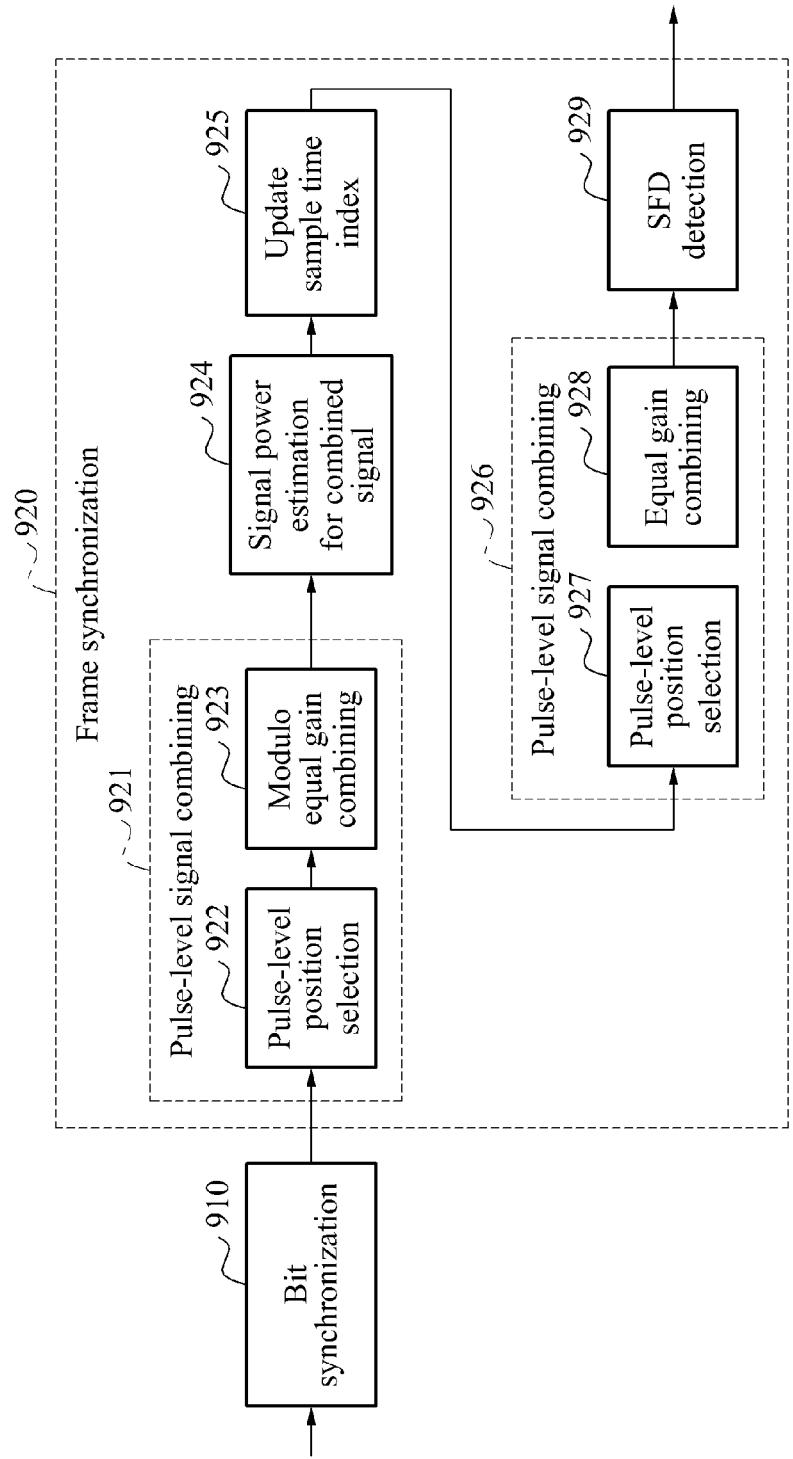
FIG. 9 is a block diagram illustrating another example of an ultra low power super-regenerative receiver.

FIG. 9 illustrates another example of an ultra low power super-regenerative receiver.

In response to a pulse-level position and a code-level position having a large correlation value being estimated in bit synchronization 910, frame synchronization 920 may perform a pulse-level signal combining 921. The large correlation value may be a maximum correlation value.

The pulse-level signal combining 921 may be performed through a pulse-level position selection 922 and a modulo equal gain combining 923. The modulo equal gain combining 923 may refer to changing samples exceeding a single bit period to samples in the same bit period. The changed samples in the same bit period may be configured to combine samples in the same bit period.

The frame synchronization 920 may estimate a signal power of a combined signal in 924, and the frame synchronization 920 may update a sample time index in 925. The frame synchronization 920 may perform a pulse-level signal combining 926. The frame synchronization 920 may select samples matching a pulse-level position selected through the pulse-level position selection 922. The samples may be selected among ADC samples. The pulse-level position selection 922 may be performed through a pulse-level position selection 927. The frame synchronization 920 may combine selected samples in an equal gain combining scheme in 928, and detect a start frame delimiter (SFD) based on the combined sample in 929.

Figure 10:
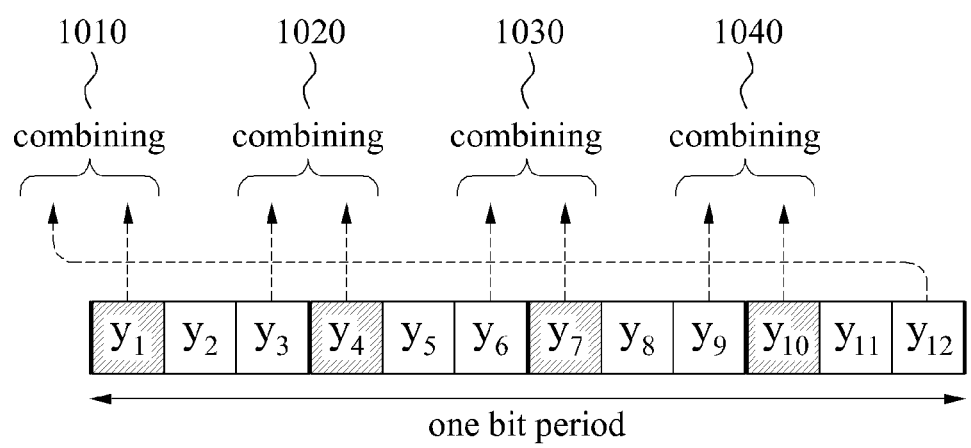
FIG. 10 is a diagram illustrating an example of combining a plurality of pulse-level positions in an ultra low power super-regenerative receiver.

FIG. 10 illustrates an example of combining a plurality of pulse-level positions in an ultra low power super-regenerative receiver.

In particular, FIG. 10 illustrates an example of a modulo equal gain combining.

FIG. 10 illustrates a case in which M (a number of samplings for a chip)=3, L (a spreading factor)=4, a pulse-level position estimated in a bit synchronization period corresponds to a first position, a position adjacent to the estimated pulse-level position on a left side is determined to be a combined object, and the modulo equal gain combining is performed for the positions.

An index of the pulse-level position estimated in the bit synchronization process may be expressed by m*=1, and m̂=m*−1=0 may express an index of the pulse-level position adjacent to the estimated pulse-level position on a left side. ADC sample values matching the estimated pulse-level position may correspond to $[y_1, y_4, y_7, y_{10}]$. ADC sample values matching the pulse-level position adjacent to the estimated pulse-level position on a left side may correspond to $[y_{12}, y_3, y_6, y_9]$. Since the corresponding sample may be absent on a left of $y_1$, $y_1$ may be combined with $y_{12}$ to be combined in the same bit period. In other words, $y_{12}$ may be used through a modulo operation process.

Since four chips may be formed for a single bit, four combined signals may be generated. The four combined signals may include a combined signal 1010 of $y_1$ and $y_{12}$, a combined signal 1020 of $y_4$ and $y_3$, a combined signal 1030 of $y_7$ and $y_6$, and a combined signal 1040 of $y_{10}$ and $y_9$.

A modulo equal gain combining may be expressed by the following equation.

$$Z_j = \sum_{m^*} y_{m^*} \text{ for } 1 \leq j \leq L,$$

where $m^* = f_{ML}(m + (j-1)M)$ and $m \in S$

In response to S relating to an index set selected in a pulse-level position selection process, $z_j$ may express an output value of a $j^{th}$ modulo equal gain combining in chronological order.

S may include an index m*(1≤m*≤M) of the pulse-level position estimated in the bit synchronization process, and each element of S may relate to m*+i in response to an index of a pulse-level position adjacent to m* by i in a right direction being selected, and may relate to m*−i in response to an index of a pulse-level position adjacent to m* by i in a left direction being selected.

After a performance of a signal processing of a modulo equal gain combining, a signal power of a combined signal may be estimated.

Figure 11:
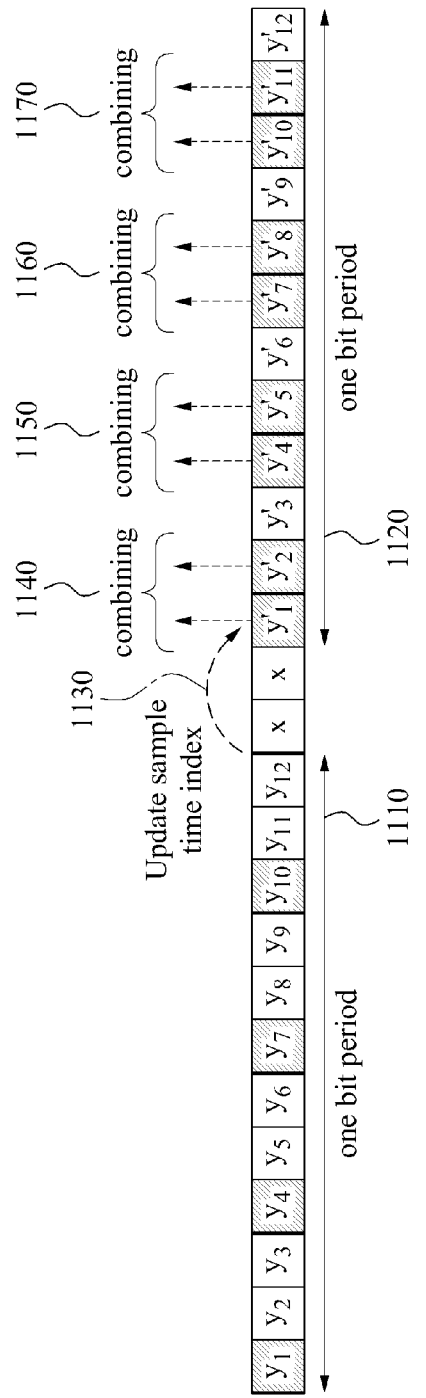
FIG. 11 is a diagram illustrating an example of updating a sample time index, and combining a plurality of pulse-level positions in an ultra low power super-regenerative receiver.

FIG. 11 illustrates an example of updating a sample time index, and combining a plurality of pulse-level positions in an ultra low power super-regenerative receiver.

A sample time index of a sampled value may be updated based on an index of a pulse-level position and an index of a code-level position estimated in a bit synchronization process, and a plurality of pulse-level positions determined.

After the sample time index is updated, an ultra low power super-regenerative receiver may perform a signal processing operation of a pulse-level signal combining.

Referring to FIG. 11, an update 1130 of a sample time index, and signal processing operations 1140, 1150, 1160, and 1170 of a pulse-level signal combining for M=3 and L=4 are illustrated.

During a first bit symbol period 1110, bit synchronization may be performed, and a signal processing of a pulse-level position selection, a modulo equal gain combining, and a signal power estimation may be performed using ADC samples of the first bit symbol period 1110.

In response to an index of a pulse-level position and an index of a code-level position estimated in a bit synchronization process corresponding to m*=1 and 1*=1, respectively, and a position immediately to a left of a position corresponding to m*=1 being selected in the signal processing of the pulse-level position selection, two ADC sample values subsequent to the first bit symbol period 1110 may be discarded, and the remaining ADC sample values may be used for frame synchronization. Since the two ADC sample values may not be values corresponding to a first chip symbol in a code sequence, the remaining ADC sample values may be used for frame synchronization.

In a second bit symbol period 1120, the signal processing operation 1140 may be performed between a first ADC sample $y'_1$ and a second ACD sample $y'_2$ for frame synchronization, and signal processing operations 1150, 1160, and 1170 may be performed at the same position for each chip unit.

Updating of a sample time index may be expressed in an equation for a general case, a description of the equation is provided in the following.

In response to an index set selected in an operation of the pulse-level position selection corresponding to S, an element having a least index among elements of the index set S may related to mmin.

A first sample time index used for the frame synchronization may correspond to a value obtained by adding $f_{ML}(m_{min}+$ (l*−1)M) to a final sample time index used for bit synchronization. In this example, l* corresponds to the index of the code-level position estimated in the bit synchronization process.

The ultra low power super-regenerative receiver may calculate an index set S' that includes elements excluding mmin from elements of the index set S, to combine a subsequent pulse-level position.

Combining samples that match each element of S' in the updated sample time index to combine a first pulse-level position.

Combining samples that match sample time indices obtained by adding (i−1)·M to sample time indices in combining of the first pulse-level position to combine an $i^{th}$ pulse-level position.

Combined signals may operate an SFD detection. The SFD detection may demodulate a plurality of bits to detect a bit sequence that informs a start of a frame.

Figure 12:
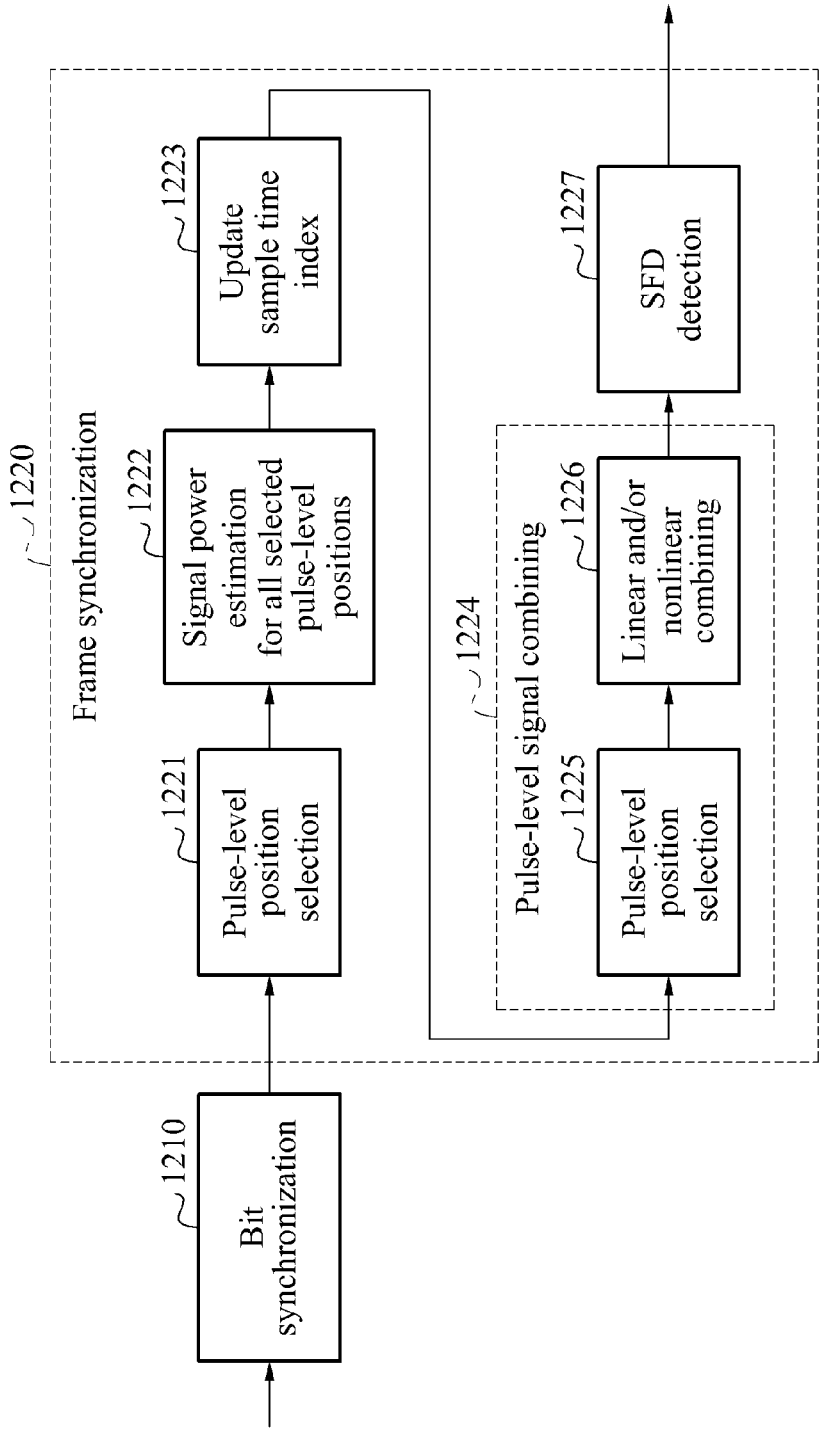
FIG. 12 is a block diagram illustrating yet another example of an ultra low power super-regenerative receiver.

FIG. 12 illustrates yet another example of an ultra low power super-regenerative receiver.

Referring to FIG. 12, in an ultra low power super-regenerative receiver, in response to a pulse-level position and a code-level position having a large correlation value being estimated in bit synchronization 1210, frame synchronization 1220 may perform a pulse-level position selection 1221, a signal power estimation for selected pulse-level positions 1222, and an update of a sample time index 1223. The large correlation value may be a maximum correlation value.

The frame synchronization 1220 may perform pulse-level signal combining 1224 based on the updated sample time index. The frame synchronization 1220 may select, among ADC samples, samples matching pulse-level positions selected through the pulse-level position selection 1221. The pulse-level position selection 1221 may be performed through a pulse-level position selection 1225.

The frame synchronization 1220 may linearly and/or non-linearly combine 1226 the selected samples, and the frame synchronization 1220 may perform an SFD detection 1227 based on the combined samples. The frame synchronization 1220 may compare the combined samples with signal power in order to detect a bit sequence.

In a data detection operation, a bit demodulation algorithm may be applied after a pulse-level position selection and a combined signal process performed in the frame synchronization, are performed. In this instance, since information relating to a signal power used in the bit demodulation algorithm is estimated in a frame synchronization process, a signal processing of estimating signal power may not be performed in the data detection operation.

Figure 13A:
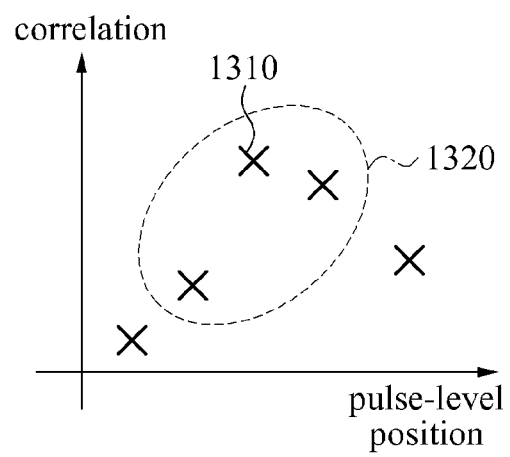
FIGS. 13A, 13B, and 13C are diagrams illustrating examples of schemes of determining a plurality of pulse-level positions in an ultra low power super-regenerative receiver.
Figure 13B:
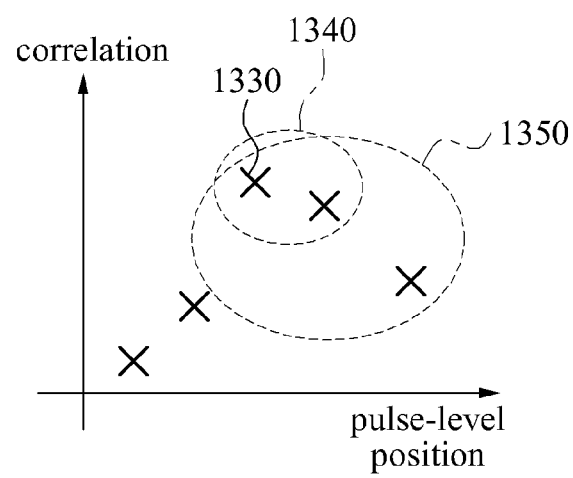
Figure 13C:
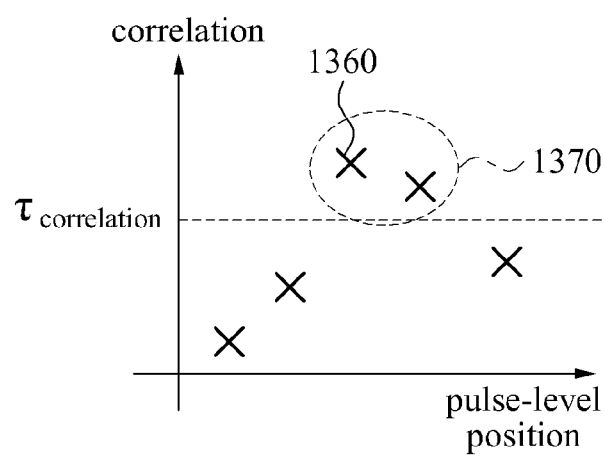

FIGS. 13A, 13B, and 13C illustrate an example of schemes for determining a plurality of pulse-level positions in an ultra low power super-regenerative receiver.

FIG. 13A illustrates an example of a scheme for determining pulse-level positions. In the pulse-level positions, a number of pulse-level positions located on a left side of a pulse-level position 1310 having a maximum correlation value may correspond to a number of pulse-level positions located on a right side of the pulse-level position 1310. FIG. 13B illustrates an example of a scheme of determining pulse-level positions in an order of sizes of correlation values. FIG. 13C illustrates an example of a scheme of determining pulse-level positions having correlation values exceeding a predetermined threshold $\tau_{correlation}$.

Referring to FIG. 13A, a dotted circle 1320 illustrates determining of two pulse-level positions, one on a left of the pulse-level position 1310 and the other on a right of the pulse-level position 1310.

Referring to FIG. 13B, a dotted circle 1340 illustrates a determining of pulse-level positions up to a pulse-level position having a second maximum correlation value based on the pulse-level position 1310 in an order of sizes of correlation values. A dotted circle 1350 illustrates a determining of pulse-level positions up to a pulse-level position having a third maximum correlation value based on the pulse-level position 1310 in an order of sizes of correlation values.

Referring to FIG. 13C, a dotted circle 1370 illustrates a determining of pulse-level positions having correlation values exceeding the predetermined threshold $\tau_{correlation}$. In this instance, a pulse-level position 1360 having a large correlation value may be included in the dotted circle 1370. The large correlation value may be a maximum correlation value.

In response to N different pulse-level positions to be combined being determined, and a number of ADC samples for a single symbol period corresponding to M, an inequality N≤M may be satisfied.

Various schemes may be used to determine pulse-level positions.

For example, a first scheme of selecting samples including a sample at a pulse-level position having a large correlation value estimated in a bit synchronization operation, n samples at pulse-level positions on a left of and adjacent to the pulse-level position having a large correlation value, and n samples at pulse-level positions on a right of and adjacent to the pulse-level position having a large correlation value may be used. The large correlation value may be a maximum correlation value. In this instance, different pulse-level positions N=2n+1 may be satisfied.

A second scheme of determining N pulse-level positions in an order of sizes of correlation values based on the pulse-level position having a large correlation value estimated in the bit synchronization operation may be used. The large correlation value may be a maximum correlation value. In this example, a value N may be determined to satisfy the inequality N≤M.

A third scheme of determining pulse-level positions having correlation values greater than or equal to the predetermined threshold $\tau_{correlation}$ in response to correlation values being calculated at pulse-level positions different from the pulse-level position having a maximum correlation value estimated in the bit synchronization operation may be used. In this example, a value N may be set to a value less than a value M. As another aspect, in the third scheme, the value N may not be set to a predetermined value, and the value N may vary depending on a channel state. The channel state may be different from the first and second schemes.

The first scheme may have a low complexity, and may include an erroneous pulse-level position among pulse-level positions on right and left sides of a pulse-level position. The pulse-level position may be placed in the middle. The second scheme may have an increased complexity, and may determine a pulse-level position. The pulse-level position may have a relatively favorable correlation value. The third scheme may have an increased complexity in response to being compared to the first scheme. The third scheme may exclude a pulse-level position having a significantly low correlation value.

Figure 14:
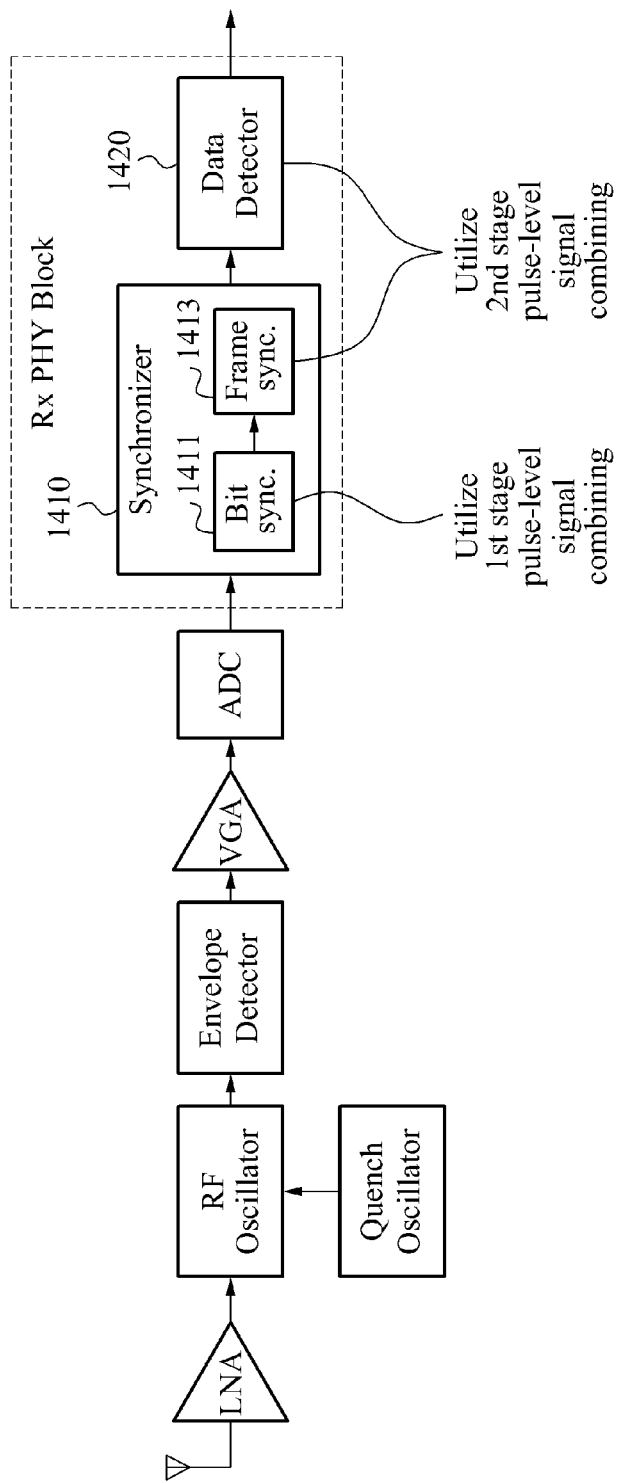
FIG. 14 is a block diagram illustrating yet another example of an ultra low power super-regenerative receiver.

FIG. 14 illustrates yet another example of an ultra low power super-regenerative receiver.

Referring to FIG. 14, an RF signal passing through an LNA is input to an SRO. The SRO may use a positive feedback loop having a gain of $K_a(t)$ to amplify an RF signal at a predetermined frequency. A quench oscillator may control a periodic generation and extinction of the oscillation. An output signal of the SRO may pass through an envelope detector and a VGA.

An ADC may sample ADC sample values for peak values of an envelope. The ADC sample values may be used for a synchronization process in a synchronizer 1410.

A synchronization signal processing may be divided into bit synchronization and frame synchronization. The bit synchronization may perform synchronization on a time axis in a bit unit and the frame synchronization may perform synchronization in a bit sequence unit. A bit sequence may indicate a start of a frame.

An ultra low power super-regenerative receiver of FIG. 14 may provide a two-stage pulse-level signal combining scheme. The two-stage pulse-level signal combining scheme may apply a pulse-level signal combining to operations of synchronization and data detection. In this example, different combining schemes may be applied between a first stage and a second stage. The first stage may correspond to a bit synchronization operation. The second stage may correspond to a data detection operation.

A bit synchronizer 1411 may use a combining scheme using a sliding window that combines samples. The samples may be combined at a plurality of neighboring pulse-level positions for possible combinations.

In response to a number of ADC samples in a single symbol period corresponding to M, and a number of different pulse-level positions to be combined corresponding to N ($\leq$M), M different sets having N elements may express each of a plurality of neighboring pulse-level positions.

A scheme of performing M different combinations having N elements may be defined as a sliding window combining scheme. In this example, N may correspond to a size of a window.

In response to $y_1, y_2, \ldots, y_M, y_{M+1}, \ldots$ expressing ADC samples in chronological order, each element of $\{y_1, y_2, \ldots, y_M\}$ may correspond to a different pulse-level position in a single symbol period, and $y_1$ and $y_{M+1}$ may correspond to the same pulse-level position in different symbol periods.

In this example, in response to a DSSS scheme being applied, a symbol may correspond to a bit symbol with a spreading factor of 1, and the symbol may correspond to a chip symbol with a spreading factor of 2 or greater.

In response to an $i^{th}$ combined ADC sample obtained through a sliding window combining corresponding to $z_i$. An equation $z_i = y_i + y_{i+1} + \ldots + y_{i+N-1}$ may express $z_i$.

$\{y_i, y_{i+1}, \ldots, y_{i+N-1}\}$ may express pulse-level positions corresponding to $z_i$. A value of $z_i$ may be calculated after values of an $i^{th}$ ADC sample $y_i$ through an $i+N-1^{th}$ ADC sample $y_{i+N-1}$ are obtained.

A combined pulse-level position having a large correlation value may be estimated using the combined ADC sample. The large correlation value may be a maximum correlation value.

An equal gain combining scheme, a linear combining scheme, a nonlinear combining scheme, a hybrid combining scheme, and the like, different from the sliding window combining scheme may be used for a frame synchronizer 1413 and a data detector 1420.

Figure 15:
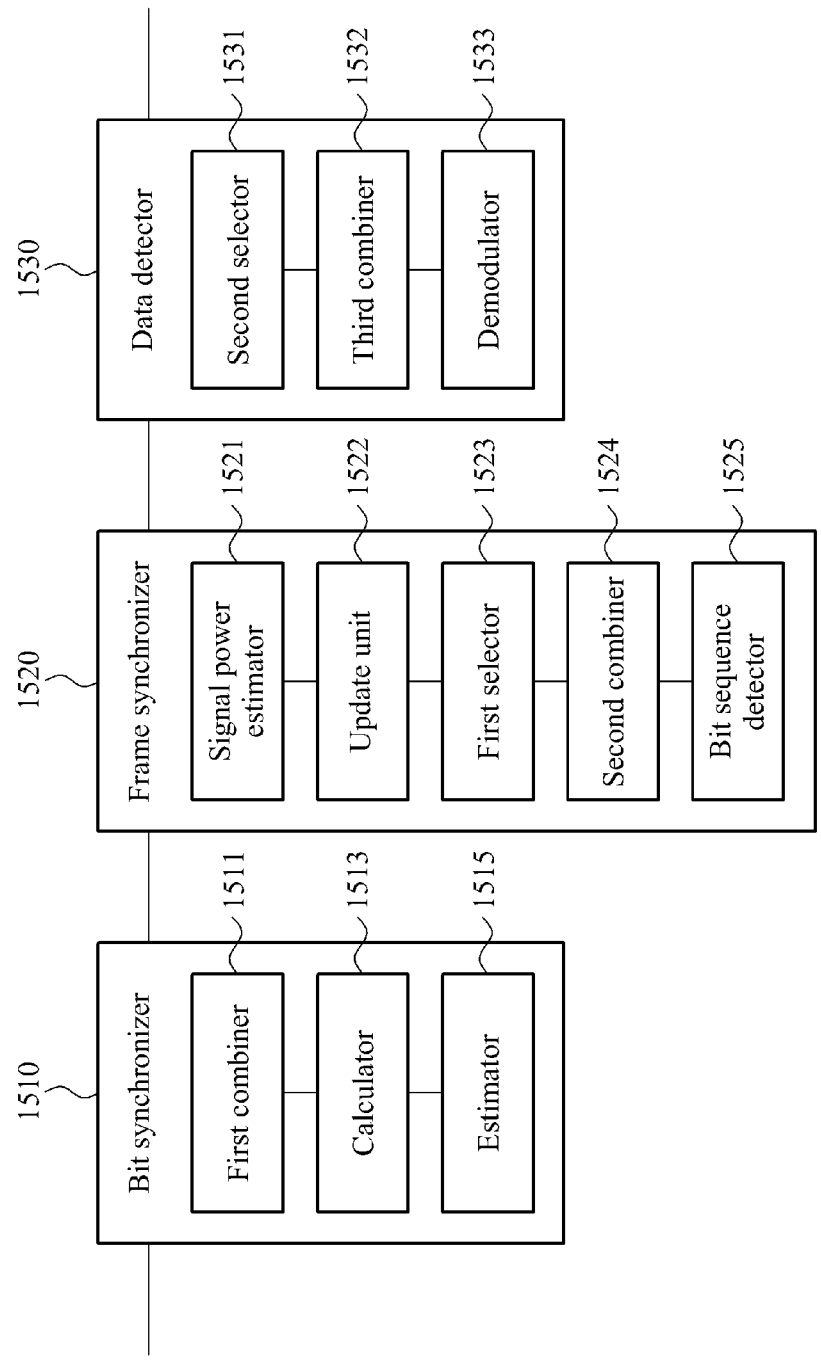
FIG. 15 is a block diagram illustrating an example of a bit synchronizer 1411, a frame synchronizer 1413, and a data detector 1420 of FIG. 14.

FIG. 15 illustrates an example of the bit synchronizer 1411, the frame synchronizer 1413, and the data detector 1420 of FIG. 14.

Referring to FIG. 15, the bit synchronizer 1411 corresponds to a bit synchronizer 1510, the frame synchronizer 1413 corresponds to a frame synchronizer 1520, and the data detector 1420 corresponds to a data detector 1530.

The bit synchronizer 1510 may use a plurality of samples included in a predetermined sliding window in a single period of a received symbol among samples taken in a signal output from a super-regenerative oscillator to estimate a combined pulse-level position and a code-level position having a maximum correlation value.

The frame synchronizer 1520 may combine a plurality of pulse-level positions selected based on the pulse-level position estimated in the bit synchronizer 1510. The frame synchronizer 1520 may use the combined plurality of pulse-level positions to detect a predetermined bit sequence. Thus, the frame synchronizer 1520 may perform frame synchronization.

The data detector 1530 may use the plurality of pulse-level positions estimated in the bit synchronizer 1510 to detect data, after the frame synchronization is completed.

The bit synchronizer 1510 includes a first combiner 1511, a calculator 1513, and an estimator 1515.

The first combiner 1511 may combine the plurality of samples included in a sliding window among the samples to generate a plurality of combination pulse-level positions.

The sliding window may have a predetermined size, and the predetermined size may be determined based on a number of the plurality of samples included in the sliding window. The sliding window may include various combinations of samples in response to the predetermined size being satisfied.

The first combiner 1511 may combine pulse-level positions that match the various combinations of samples included in the sliding window to generate the plurality of combination pulse-level positions.

The calculator 1513 may calculate correlation values between the plurality of combination pulse-level positions and an original code sequence, and calculate correlation values between the plurality of combination pulse-level positions and a circularly shifted code sequence.

The estimator 1515 may estimate the code-level position and a combination pulse-level position having a large correlation value as a result of a calculation. The calculator 1513 may perform the calculation. The large correlation value may be a maximum correlation value.

The bit synchronizer 1510 may use the estimated combination pulse-level position and code-level position to synchronize a bit of a transmitted symbol and a bit of a received symbol.

The frame synchronizer 1520 includes a signal power estimator 1521, an update unit 1522, a first selector 1523, a second combiner 1524, and a bit sequence detector 1525.

The signal power estimator 1521 may estimate a signal power of the combination pulse-level position estimated in the estimator 1515.

The update unit 1522 may update a sample time index of values sampled in a bit synchronization operation based on an index of the combination pulse-level position and an index of the code-level position estimated in the estimator 1515.

The first selector 1523 may select a plurality of pulse-level positions corresponding to the combination pulse-level position estimated in the bit synchronizer 1510. The combination pulse-level position may be estimated based on the updated sample time index. The first selector 1523 may select a plurality of pulse-level positions corresponding to combination pulse-level positions estimated for samples taken subsequent to samples used in the bit synchronization operation.

The second combiner 1524 may combine the plurality of pulse-level positions selected in the first selector 1523. The second combiner 1524 may use an equal gain combining scheme to perform a combination.

The bit sequence detector 1525 may detect a predetermined bit sequence based on a signal generated through a combination and the signal power. The second combiner 1524 may perform the combination. The signal power estimator 1521 may estimate the signal power. The signal power estimated by the signal power estimator 1521 may be a criterion for determining whether a detected bit value corresponds to a value of "0" or a value of "1."

The data detector 1530 includes a second selector 1531, a third combiner 1532, and a demodulator 1533.

The second selector 1531 may select a plurality of pulse-level positions corresponding to the combination pulse-level position estimated by the estimator 1515, based on the updated sample time index. The plurality of pulse-level positions may be selected after the predetermined bit sequence is detected by the bit sequence detector 1525.

The second selector 1531 may select samples matching the combination pulse-level position estimated by the estimator 1515 for samples taken subsequent to samples used in the frame synchronization operation.

The third combiner 1532 may combine the plurality of pulse-level positions. The second selector 1531 may select the pulse-level positions. The third combiner 1532 may use the equal gain combining scheme to perform a combination.

The demodulator 1533 may demodulate data based on a signal generated through a combination performed by the third combiner 1532 and the signal power. The signal power estimator 1521 may estimate the signal power.

According to another aspect, in an ultra low power super-regenerative receiver, the frame synchronizer 1520 and the data detector 1530 may operate differently.

The frame synchronizer 1520 includes a signal power estimator 1521, an update unit 1522, a first selector 1523, a second combiner 1524, and a bit sequence detector 1525.

The signal power estimator 1521 may estimate a signal power of each of pulse-level positions included in the combination pulse-level position. The estimator 1515 may estimate the combination pulse-level position.

The update unit 1522 may update a sample time index of values sampled in a bit synchronization operation based on an index of the combination pulse-level position estimated by the estimator 1515, and an index of the code-level position. The estimator 1515 may estimate the index of the code-level position.

The first selector 1523 may select a plurality of pulse-level positions corresponding to the combination pulse-level position based on the updated sample time index. The estimator 1515 may estimate the combination pulse-level position.

The second combiner 1524 may linearly combine or non-linearly combine the plurality of pulse-level positions. The first selector 1523 may select the plurality of pulse-level positions. The second combiner 1524 may determine a linear combination or a nonlinear combination based on a signal power of each of the selected plurality of pulse-level positions. The second combiner 1524 may determine a weighting applied to each pulse-level position based on a signal power of each of the selected plurality of pulse-level positions.

The bit sequence detector 1525 may detect a predetermined bit sequence based on a signal generated through a combination and the signal power estimated by the signal power estimator 1521. The second combiner 1524 may perform the combination.

The data detector 1530 includes a second selector 1531, a third combiner 1532, and a demodulator 1533.

The second selector 1531 may select a plurality of pulse-level positions corresponding to the combination pulse-level position estimated by the estimator 1515, based on the updated sample time index. The selection of the plurality of pulse-level positions may occur after the bit sequence detector 1525 detects the predetermined bit sequence.

The third combiner 1532 may combine the plurality of pulse-level positions selected by the second selector 1531 in a combining scheme used by the second combiner 1524. In response to the second combiner 1524 using the nonlinear combination, the third combiner 1532 may also use the nonlinear combination.

The demodulator 1533 may demodulate data based on a signal and the signal power estimated by the signal power estimator 1521. The third combiner 1532 may generate the signal through a combination.

Figure 16:
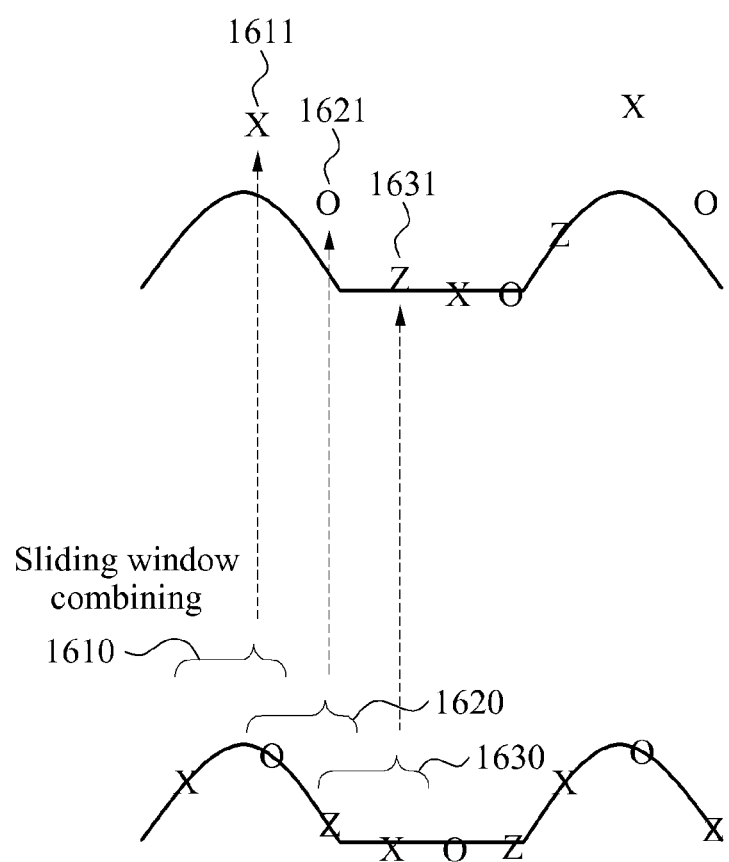
FIG. 16 is a diagram illustrating an example of combining a plurality of pulse-level positions using a sliding window in an ultra low power super-regenerative receiver.

FIG. 16 illustrates an example of using a sliding window in an ultra low power super-regenerative receiver to combine a plurality of pulse-level positions.

Referring to FIG. 16, in this instance, a DSSS is used, and a spreading factor is equal to a value of 2. Furthermore, three samples are performed in a single chip symbol, in other words, M=3, and a size of a sliding window equals 2, in other words, N=2.

A figure at a bottom of FIG. 16 illustrates a waveform of an RF input signal during a bit period of a single Sync. Header (SHR), and ADC samples taken from pulse-level positions. The pulse-level positions may be different from each other.

A figure at a top of FIG. 16 illustrates a waveform of an RF input signal during a bit period of a single SHR, and sizes of combined ADC samples 1611, 1621, and 1631 in response to values of the ADC samples being combined using sliding windows 1610, 1620, and 1630.

The combined ADC samples 1611, 1621, and 1631 may have a size greatly varied in comparison to ADC samples before a combination is performed. Thus, an optimum pulse-level position may be easily estimated.

Figure 17:
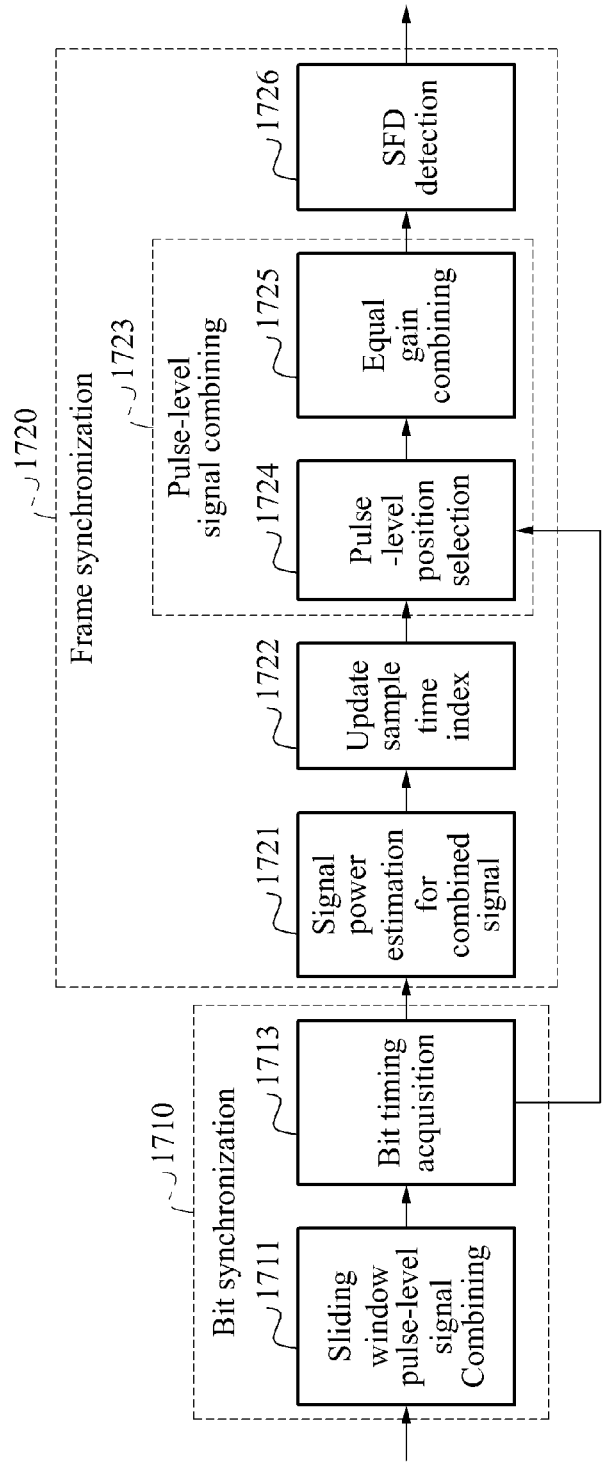
FIG. 17 is a block diagram illustrating another example of an ultra low power super-regenerative receiver.

FIG. 17 illustrates another example of an ultra low power super-regenerative receiver.

Bit synchronization 1710 may use a sliding window in 1711 to combine a plurality of pulse-level positions among ADC samples, and may estimate a code-level position and a combined pulse-level position having a large correlation value using the combined ADC samples. The large correlation value may be a maximum correlation value.

In response to the code-level position and the combined pulse-level position having a large correlation value being estimated, the bit synchronization 1710 may acquire a bit timing used for bit synchronization in 1713. The large correlation value may be a maximum correlation value.

Frame synchronization 1720 may estimate a signal power of the combined pulse-level position in 1721, and update a sample time index in 1722.

The frame synchronization 1720 may perform a pulse-level signal combining 1723 based on the updated sample time index. The frame synchronization 1720 may select samples matching the combined pulse-level position having a large correlation value, which may be performed through a pulse-level position selection 1724. The samples may be selected from ADC samples. The large correlation value may be a maximum correlation value.

The frame synchronization 1720 may combine the selected samples in an equal gain combining scheme in 1725, and may detect an SFD based on the combined samples in 1726. The frame synchronization 1720 may compare the combined samples with an estimated signal power to detect a bit sequence.

In a data detection operation, a bit demodulation algorithm may be applied after a pulse-level position selection and a combined signal processing, performed in frame synchronization, are performed. In this instance, since information about a signal power used in the bit demodulation algorithm is estimated in a frame synchronization process, a signal processing of estimating signal power may not be performed in the data detection operation.

In a two-stage pulse-level signal combining scheme, since pulse-level positions are selected in a bit synchronization operation corresponding to a first stage, the selected pulse-level positions may be used in a second stage.

In response to an index of the combined pulse-level position and an index of the code-level position having a large correlation value corresponding to $m^*_{comb}$ and $l^*_{comb}$, respectively in the bit synchronization operation, a combination of pulse-level positions thereafter may be performed along with an update of the sample time index. The large correlation value may be a maximum correlation value.

A first sample time index used for a combination of pulse-level positions in the frame synchronization process may correspond to a value. The value may be obtained by adding $m^*_{comb}+(l^*_{comb}-1)M$ to the first sample time index among ADC samples included in a last sliding window used for the bit synchronization operation.

N sample time indices starting from the first sample time index may be combined to perform a first combination of pulse-level positions.

Sample time indices obtained by adding $(i-1)\cdot M$ to each of the sample time indices used for the first combination of pulse-level positions may be combined to perform an $i^{th}$ combination of pulse-level positions.

Figure 18:
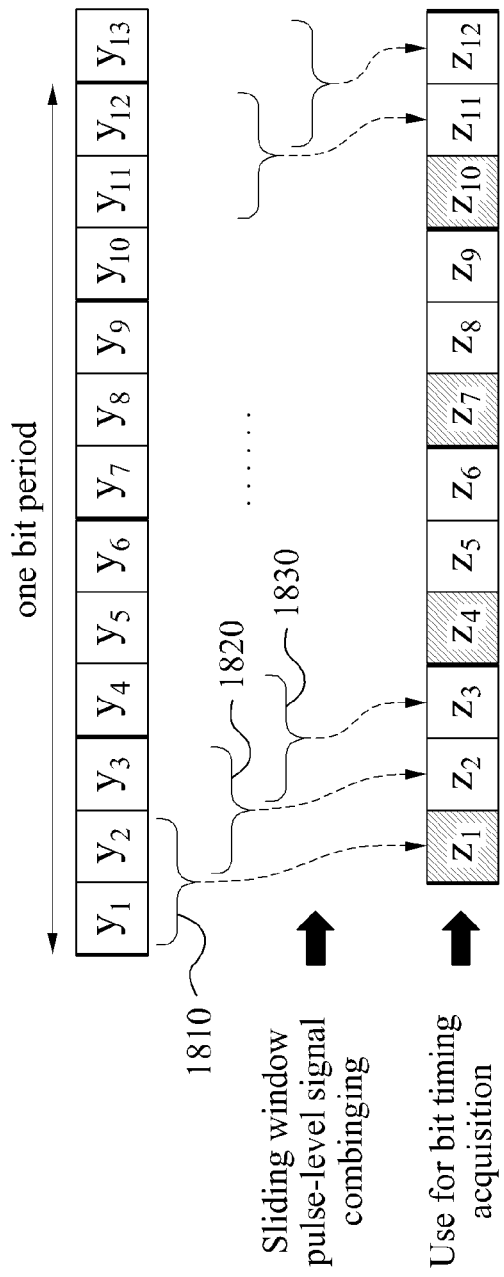
FIG. 18 is a diagram illustrating an example of performing bit synchronization using a sliding window in an ultra low power super-regenerative receiver.

FIG. 18 illustrates an example of using a sliding window in an ultra low power super-regenerative receiver to perform bit synchronization.

In response to two samples being combined in a single bit period for M (a number of samplings for a chip symbol)=3, L (a spreading factor)=4, and N (a sliding window)=2, twelve combined samples may be generated for thirteen samples. A sample $y_{13}$ in another bit period may be used to generate the twelve combined samples.

A combined sample $z_1$ may be generated through a combination 1810 of $y_1$ and $y_2$, a combined sample $z_2$ may be generated through a combination 1820 of $y_2$ and $y_3$, a combined sample $z_3$ may be generated through a combination 1830 of $y_3$ and $y_4$, and may be generated up to a combined sample $z_{12}$ by repeatedly performing combinations.

An ultra low power super-regenerative receiver may calculate a maximum correlation value through a correlation with a code sequence for combined samples. Bit synchronization may be performed based on combined samples having the maximum correlation value, in other words, combined pulse-level positions having the maximum correlation value.

Figure 19:
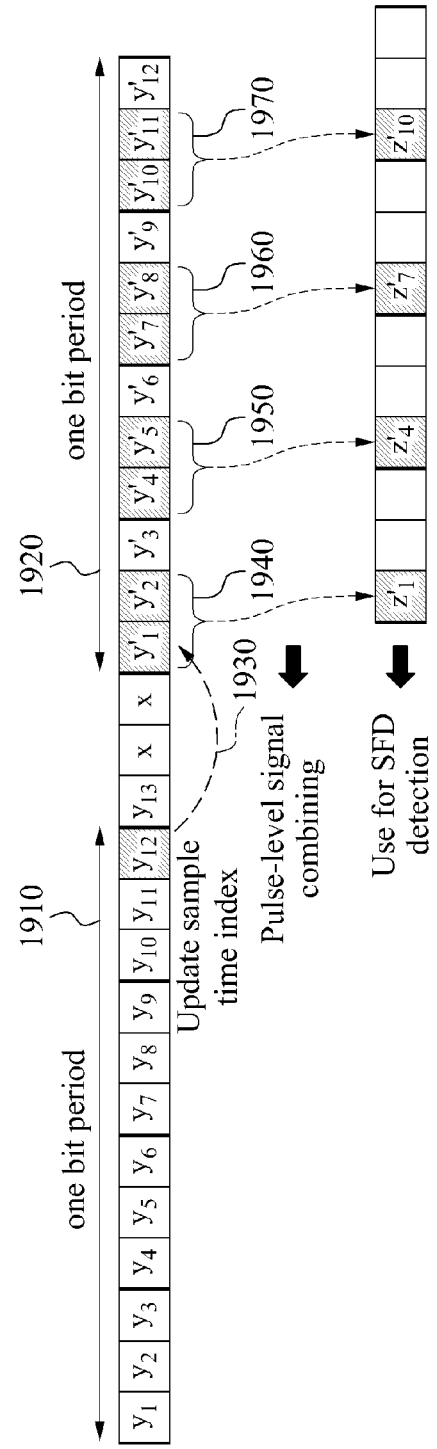
FIG. 19 is a diagram illustrating an example of updating a sample time index, and detecting a bit sequence.

FIG. 19 illustrates an example of updating a sample time index, and detecting a bit sequence using a sliding window used for bit synchronization in an ultra low power super-regenerative receiver.

A sample time index of a sampled value may be updated based on an index of a combined pulse-level position and an index of a code-level position estimated in a bit synchronization operation.

After the sample time index is updated, an ultra low power super-regenerative receiver may once again perform a signal processing operation of a pulse-level signal combining.

FIG. 19 illustrates an update 1930 of a sample time index, and signal processing operations 1940, 1950, 1960, and 1970 of a pulse-level signal combining for M=3, L=4, $m^*_{comb}=1$, and $l^*_{comb}=2$.

Bit synchronization may be performed during a first bit symbol period 1910, and ADC samples of the first bit symbol period 1910 may be used to perform a combination of pulse-level positions using a sliding window, an estimation of a combined pulse-level position and a code-level position having a maximum correlation value, and a signal processing of a signal power estimation for the estimated pulse-level position.

Two ADC sample values subsequent to $y_{13}$ corresponding to a last sample of the first bit symbol period 1910 may be discarded. Since the two ADC sample values do not correspond to a first chip symbol in a code sequence, the remaining ADC sample values may be used for frame synchronization.

In a second bit symbol period 1920, a combination 1940 may be performed between a first ADC sample $y'_1$ and a second ADC sample $y'_2$ as a size 2 of a sliding window to perform frame synchronization, and combinations 1950, 1960, and 1970 may be performed at the same position for each chip unit.

Combined signals $z'_1$, $z'_4$, $z'_7$, and $z'_{10}$ may used for detecting an SFD.

Figure 20:
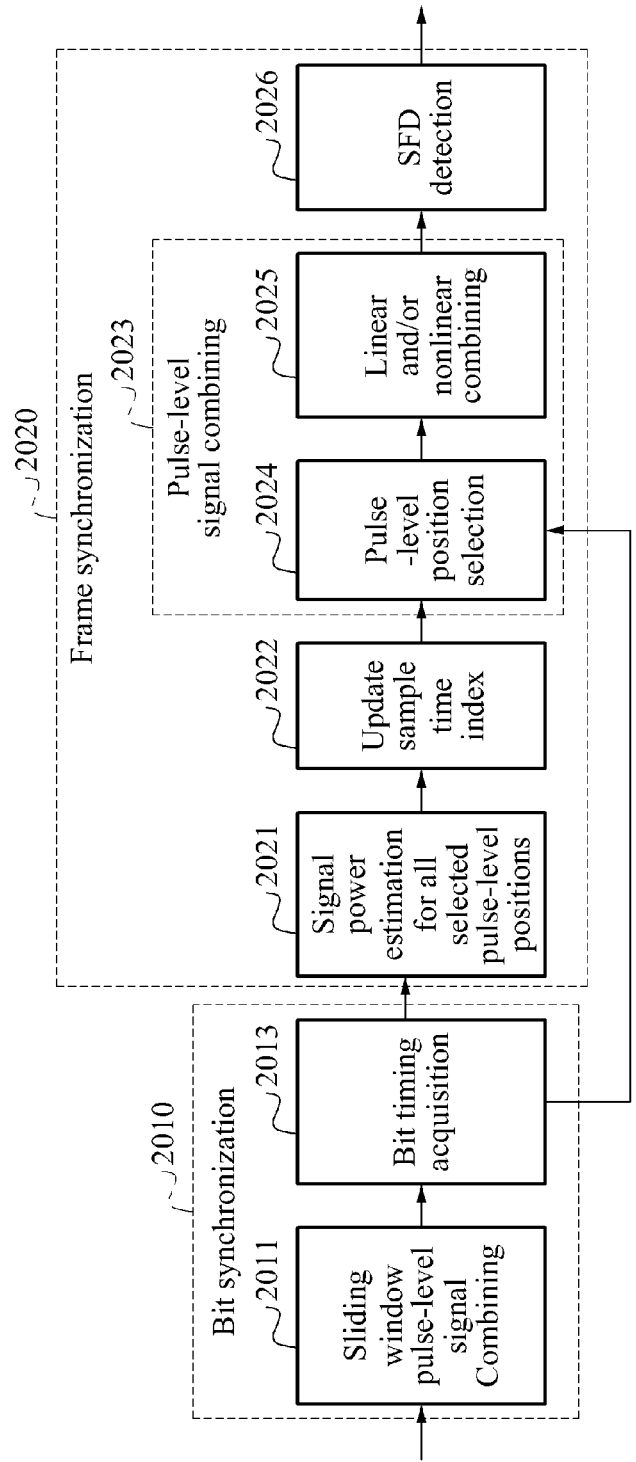
FIG. 20 is a block diagram illustrating another example of an ultra low power super-regenerative receiver.

FIG. 20 illustrates another example of an ultra low power super-regenerative receiver.

Bit synchronization 2010 may use a sliding window in 2011 to combine a plurality of pulse-level positions among ADC samples, and may estimate a code-level position and a combined pulse-level position having a large correlation value using the combined ADC samples. The large correlation value may be a maximum correlation value.

In response to the code-level position and the combined pulse-level position having a large correlation value being estimated, the bit synchronization 2010 may acquire a bit timing used for bit synchronization in 2013. The large correlation value may be a maximum correlation value.

Frame synchronization 2020 may estimate a signal power of each of pulse-level positions included in the combined pulse-level position in 2021, and update a sample time index in 2022.

The frame synchronization 2020 may perform a pulse-level signal combining 2023 based on the updated sample time index. The frame synchronization 2020 may select samples matching the combined pulse-level position having a large correlation value, which may be performed through a pulse-level position selection 2024. The samples may be selected from ADC samples. The large correlation value may be a maximum correlation value.

The frame synchronization 2020 may combine the selected samples in a linear combining scheme, a nonlinear combining scheme, or a hybrid combining scheme (in other words, a combination of the linear combining scheme and the nonlinear combining scheme) in 2025, and may detect an SFD based on the combined samples in 2026. The frame synchronization 2020 may compare the combined samples with a signal power of each of the estimated pulse-level positions to detect a bit sequence.

In a data detection operation, a bit demodulation algorithm may be applied after a pulse-level position selection and a combined signal processing, performed in frame synchronization, are performed. In this instance, since information about a signal power used in the bit demodulation algorithm is estimated in a frame synchronization process, a signal processing of estimating signal power may not be performed in the data detection operation.

Program instructions to perform a method described herein, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable storage mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein. Also, the described unit to perform an operation or a method may be hardware, software, or some combination of hardware and software. For example, the unit may be a software package running on a computer or the computer on which that software is running.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An ultra low power super-regenerative receiver, comprising:
   a bit synchronizer configured to use a value sampled from a signal output from a super-regenerative oscillator, and estimate a pulse-level position having a maximum correlation value in a single period of a received symbol;
   a frame synchronizer configured to combine a plurality of pulse-level positions determined based on the estimated pulse-level position, and detect a predetermined bit sequence using the plurality of pulse-level positions combined, the frame synchronizer comprising
      a combined object determiner configured to determine a plurality of pulse-level positions to be combined based on the estimated pulse-level position; and
      a signal power estimator configured to estimate a signal power of a signal generated by a combination of the determined plurality of pulse-level positions; and
   a data detector configured to detect data using the plurality of pulse-level positions determined after the frame synchronization is completed.

2. The ultra low power super-regenerative receiver of claim 1, wherein the bit synchronizer estimates a code-level position having a maximum correlation value in the single period of the received symbol.

3. The ultra low power super-regenerative receiver of claim 2, wherein the frame synchronizer comprises:
   a first combiner configured to combine the determined plurality of pulse-level positions in the same bit period.

4. The ultra low power super-regenerative receiver of claim 3, wherein the combined object determining unit determines pulse-level positions in which a number of pulse-level positions located on a left side of the estimated pulse-level position corresponds to a number of pulse-level positions located on a right side of the estimated pulse-level position, in the single period of the received symbol.

5. The ultra low power super-regenerative receiver of claim 3, wherein the combined object determining unit calculates correlation values of pulse-level positions adjacent to the estimated pulse-level position in the single period of the received symbol, and determines the plurality of pulse-level positions in an order of sizes of the correlation values.

6. The ultra low power super-regenerative receiver of claim 3, wherein the combined object determining unit calculates correlation values of pulse-level positions adjacent to the estimated pulse-level position in the single period of the received symbol, and determines pulse-level positions having correlation values exceeding a predetermined threshold to be the plurality of pulse-level positions to be combined.

7. The ultra low power super-regenerative receiver of claim 3, wherein the frame synchronizer further comprises:
   an update unit configured to update a sample time index of a sampled value based on an index of the estimated pulse-level position, an index of the estimated code-level position, and the plurality of pulse-level positions determined;
   a first selector configured to select the plurality of pulse-level positions determined by the combined object determining unit based on the updated sample time index;
   a second combiner configured to combine the plurality of pulse-level positions selected; and
   a bit sequence detector configured to detect the predetermined bit sequence based on a signal generated through a combination of the plurality of pulse-level positions by the second combiner and the signal power estimated by the signal power estimator.

8. The ultra low power super-regenerative receiver of claim 7, wherein the data detector comprises:
   a second selector configured to select the plurality of pulse-level positions determined by the combined object determining unit, based on the updated sample time index, after the predetermined bit sequence is detected;
   a third combiner configured to combine the plurality of pulse-level positions selected by the second selector; and
   a demodulator configured to demodulate data based on a signal generated through combination of the plurality of pulse-level positions by the third combiner and the signal power estimated by the signal power estimator.

9. The ultra low power super-regenerative receiver of claim 2, wherein:
   the signal power estimator is configured to estimate a signal power of each of the plurality of pulse-level positions determined.

10. The ultra low power super-regenerative receiver of claim 9, wherein the frame synchronizer further comprises:
   an update unit configured to update a sample time index of a sampled value based on an index of the estimated pulse-level position, an index of the estimated code-level position, and the plurality of pulse-level positions determined;
   a first selector configured to select the plurality of pulse-level positions determined by the combined object determining unit based on the updated sample time index;
   a first combiner configured to linearly combine or nonlinearly combine the plurality of selected pulse-level positions; and
   a bit sequence detector configured to detect the predetermined bit sequence based on a signal generated through combination of the plurality of pulse-level positions by the first combiner and the signal power of each of the plurality of pulse-level positions estimated by the signal power estimator.

11. The ultra low power super-regenerative receiver of claim 10, wherein the data detector comprises:
a second selector configured to select the plurality of pulse-level positions determined by the combined object determining unit, based on the updated sample time index, after the predetermined bit sequence is detected;
a second combiner configured to combine the plurality of pulse-level positions selected by the second selector in a combining scheme used by the first combiner; and
a demodulator configured to demodulate data based on a signal generated through a combination of the plurality of pulse-level positions by the second combiner and the signal power estimated by the signal power estimator.

12. An ultra low power super-regenerative receiver, comprising:
a bit synchronizer configured to estimate a pulse-level position and a code-level position having a maximum correlation value using a plurality of samples included in a predetermined sliding window in a single period of a received symbol among samples taken in a signal output from a super-regenerative oscillator;
a frame synchronizer configured to combine a plurality of pulse-level positions determined based on the estimated pulse-level position, and detect a predetermined bit sequence using the combined plurality of pulse-level positions; and
a data detector configured to detect data using the plurality of estimated pulse-level positions, after the frame synchronization is completed.

13. The ultra low power super-regenerative receiver of claim 12, wherein the bit synchronizer comprises:
a first combiner configured to combine the plurality of samples included in the predetermined sliding window among the samples to generate a plurality of combination pulse-level positions;
a calculator configured to calculate correlation values between the plurality of combination pulse-level positions and an original code sequence, and calculate correlation values between the plurality of combination pulse-level positions and a circularly shifted code sequence; and
an estimator configured to estimate the code-level position and a combination pulse-level position having a maximum correlation value as a result of calculation.

14. The ultra low power super-regenerative receiver of claim 12, wherein the frame synchronizer comprises:
a signal power estimator configured to estimate a signal power of the estimated combination pulse-level position;
an update unit configured to update a sample time index of sampled values based on an index of the estimated combination pulse-level position, and an index of the estimated code-level position;
a first selector configured to select a plurality of pulse-level positions corresponding to the estimated combination pulse-level position based on the updated sample time index;
a second combiner configured to combine the selected plurality of pulse-level positions; and
a bit sequence detector configured to detect the predetermined bit sequence based on a signal generated through combination of the plurality of pulse-level positions by the second combiner and the signal power estimated by the signal power estimator.

15. The ultra low power super-regenerative receiver of claim 14, wherein the data detector comprises:
a second selector configured to select a plurality of pulse-level positions corresponding to the estimated combination pulse-level position, based on the updated sample time index, after the predetermined bit sequence is detected;
a third combiner configured to combine the plurality of selected pulse-level positions; and
a demodulator configured to demodulate data based on a signal generated through combination of the plurality of pulse-level positions by the third combiner and the signal power estimated by the signal power estimator.

16. The ultra low power super-regenerative receiver of claim 13, wherein the frame synchronizer comprises:
a signal power estimator configured to estimate a signal power of each of pulse-level positions included in the estimated combination pulse-level position;
an update unit configured to update a sample time index of sampled values based on an index of the estimated combination pulse-level position, and an index of the estimated code-level position;
a first selector configured to select a plurality of pulse-level positions corresponding to the estimated combination pulse-level position based on the updated sample time index;
a second combiner configured to linearly combine or non-linearly combine the plurality of pulse-level positions selected; and
a bit sequence detector configured to detect the predetermined bit sequence based on a signal generated through combination of the plurality of pulse-level positions by the second combiner and the signal power estimated by the signal power estimator.

17. The ultra low power super-regenerative receiver of claim 16, wherein the data detector comprises:
a second selector configured to select a plurality of pulse-level positions corresponding to the estimated combination pulse-level position, based on the updated sample time index, after the predetermined bit sequence is detected;
a third combiner configured to combine the plurality of pulse-level positions selected by the second selector in a combining scheme used by the second combiner; and
a demodulator configured to demodulate data based on a signal generated through combination of the plurality of pulse-level positions by the third combiner and the signal power estimated by the signal power estimator.

18. An ultra low power super-regenerative receiving method, comprising:
estimating, using a value sampled from a signal output from a super-regenerative oscillator, a pulse-level position having a maximum correlation value in a single period of a received symbol;
combining a plurality of pulse-level positions determined based on the estimated pulse-level position, wherein the combining comprises
determining a plurality of pulse-level positions to be combined based on the estimated pulse-level position, and
estimating a signal power of a signal generated by a combination of the determined plurality of pulse-level positions;
performing frame synchronization by detecting a predetermined bit sequence using the plurality of pulse-level positions combined; and detecting data using the plurality of pulse-level positions determined after the frame synchronization is completed.

19. The ultra low power super-regenerative receiving method of claim 18, wherein the combining comprises:

combining the determined plurality of pulse-level positions in the same bit period.

20. An ultra low power super-regenerative receiving method, comprising:

estimating a pulse-level position and a code-level position having a maximum correlation value using a plurality of samples included in a predetermined sliding window in a single period of a received symbol among samples taken in a signal output from a super-regenerative oscillator;

combining a plurality of pulse-level positions determined based on the estimated pulse-level position;

performing frame synchronization by detecting a predetermined bit sequence using the combined plurality of pulse-level positions; and detecting data using the plurality of pulse-level positions estimated, after the frame synchronization is completed.

21. The ultra low power super-regenerative receiving method of claim 20, wherein the estimating comprises:

combining the plurality of samples included in the predetermined sliding window among the samples to generate a plurality of combination pulse-level positions;

calculating correlation values between the plurality of combination pulse-level positions and an original code sequence, and calculating correlation values between the plurality of combination pulse-level positions and a circularly shifted code sequence; and estimating the code-level position and a combination pulse-level position having a maximum correlation value as a result of calculation.

* * * * *